(12) United States Patent
Katsuno et al.

(10) Patent No.: US 9,130,127 B2
(45) Date of Patent: Sep. 8, 2015

(54) SEMICONDUCTOR LIGHT EMITTING DEVICE

(75) Inventors: Hiroshi Katsuno, Tokyo (JP); Yasuo Ohba, Kanagawa-ken (JP); Satoshi Mitsugi, Kanagawa-ken (JP); Shinji Yamada, Tokyo (JP); Mitsuhiro Kushibe, Tokyo (JP); Kei Kaneko, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 636 days.

(21) Appl. No.: 13/204,082

(22) Filed: Aug. 5, 2011

(65) Prior Publication Data

US 2012/0235168 A1 Sep. 20, 2012

(30) Foreign Application Priority Data

Mar. 14, 2011 (JP) .................................. 2011-55859

(51) Int. Cl.
*H01L 33/38* (2010.01)
*H01L 33/22* (2010.01)

(52) U.S. Cl.
CPC .............. *H01L 33/382* (2013.01); *H01L 33/22* (2013.01); *H01L 33/385* (2013.01); *H01L 2224/48091* (2013.01); *H01L 2224/73265* (2013.01); *H01L 2933/0091* (2013.01)

(58) Field of Classification Search
CPC ......... H01L 33/16; H01L 33/20; H01L 33/22; H01L 33/34; H01L 33/382; H01L 33/385
USPC ...................... 257/88, 98, E33.002, E33.067, 257/E33.074, E33.068; 438/22, 29
See application file for complete search history.

(56) References Cited

U.S. PATENT DOCUMENTS

| 6,828,596 B2 * | 12/2004 | Steigerwald et al. ........... 257/99 |
| 2003/0006409 A1 | 1/2003 | Ohba |

(Continued)

FOREIGN PATENT DOCUMENTS

| JP | 2003-224297 | 8/2003 |
| JP | 2011-66048 | 3/2011 |

(Continued)

OTHER PUBLICATIONS

U.S. Appl. No. 12/873,678, filed Sep. 1, 2010, Hiroshi Katsuno, et al.
U.S. Appl. No. 12/873,670, filed Sep. 1, 2010, Hiroshi Katsuno, et al.
Ansgar Laubsch, et al., "High-Power and High-Efficiency InGaN-Based Light Emitters", IEEE Transactions on Electron Devices, vol. 57, No. 1, Jan. 2010, pp. 79-87.

(Continued)

*Primary Examiner* — Zandra Smith
*Assistant Examiner* — Lauren R Bell
(74) *Attorney, Agent, or Firm* — Oblon, McClelland, Maier & Neustadt, L.L.P.

(57) ABSTRACT

According to one embodiment, a semiconductor light emitting device includes a stacked structure body, first and second electrodes. The stacked structure body includes first and second semiconductor layers and a light emitting layer provided between the second and first semiconductor layers, and has first and second major surfaces. The first electrode has a first contact part coming into contact with the first semiconductor layer. The second electrode has a part coming into contact with the second semiconductor layer. A surface of the first semiconductor layer on a side of the first major surface has a first part having a part overlapping a contact surface with the first semiconductor layer and a second part having a part overlapping the second semiconductor layer. The second part has irregularity. A pitch of the irregularity is longer than a peak wavelength of emission light. The first part has smaller irregularity than the second part.

15 Claims, 14 Drawing Sheets

(56) References Cited

U.S. PATENT DOCUMENTS

| | | |
|---|---|---|
| 2006/0204865 A1* | 9/2006 | Erchak et al. .................... 430/7 |
| 2009/0101923 A1* | 4/2009 | Choi et al. ...................... 257/89 |
| 2009/0108279 A1* | 4/2009 | Kim ................................ 257/98 |
| 2009/0159908 A1* | 6/2009 | David et al. .................... 257/95 |
| 2010/0055819 A1 | 3/2010 | Ohba et al. |
| 2010/0096652 A1* | 4/2010 | Choi et al. ...................... 257/98 |
| 2010/0224897 A1* | 9/2010 | Huang et al. ................... 257/98 |
| 2011/0062488 A1* | 3/2011 | Uemura et al. ............... 257/103 |

FOREIGN PATENT DOCUMENTS

| | | |
|---|---|---|
| WO | WO 2006/093018 A1 | 9/2006 |
| WO | WO 2009-121319 | 10/2009 |
| WO | WO 2009-155897 | 12/2009 |

OTHER PUBLICATIONS

T. Fujii, et al., "Increase in the extraction efficiency of GaN-based light-emitting diodes via surface roughening", Applied Physics Letters, vol. 84, No. 6, Feb. 9, 2004, pp. 855-857.
Office Action issued Apr. 19, 2012, in Japanese Patent Application No. 2011-055859 with English translation.
Notification of Reason(s) for Refusal issued Jan. 13, 2012 in Japanese Patent Application No. 2010-055859 (with English translation).
Japanese Office Action issued Oct. 7, 2011, in Patent Application No. 2011-055859 (with English-language translation).
Office Action issued Feb. 2, 2015, in Japanese patent application No. 2014-076811 (w/English translation).
Office Action issued Jan. 6, 2015, in Japanese patent application No. 2012-124360 (w/English translation).

* cited by examiner

US 9,130,127 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2011-055859, filed on Mar. 14, 2011; the entire contents of which are incorporated herein by reference.

FIELD

Embodiments described herein relate generally to a semiconductor light emitting device.

BACKGROUND

As a semiconductor light emitting device such as an LED (Light Emitting Diode), there is a structure in which, for example, a crystal layer formed on a sapphire substrate is bonded to a conductive substrate and the sapphire substrate is removed. In such a structure, in order to improve light extraction efficiency, processing to form irregularity is performed on the surface of crystal that is exposed by removing the sapphire substrate. Furthermore, there is also another structure in which no electrode is formed on the surface of a crystal layer that serves as a light extraction surface and a p-side electrode and an n-side electrode are formed on the crystal surface on the opposite side of the surface from which the sapphire substrate is removed. In such a semiconductor light emitting device, further improvement in light extraction efficiency is required.

DETAILED DESCRIPTION

Figure 1A:
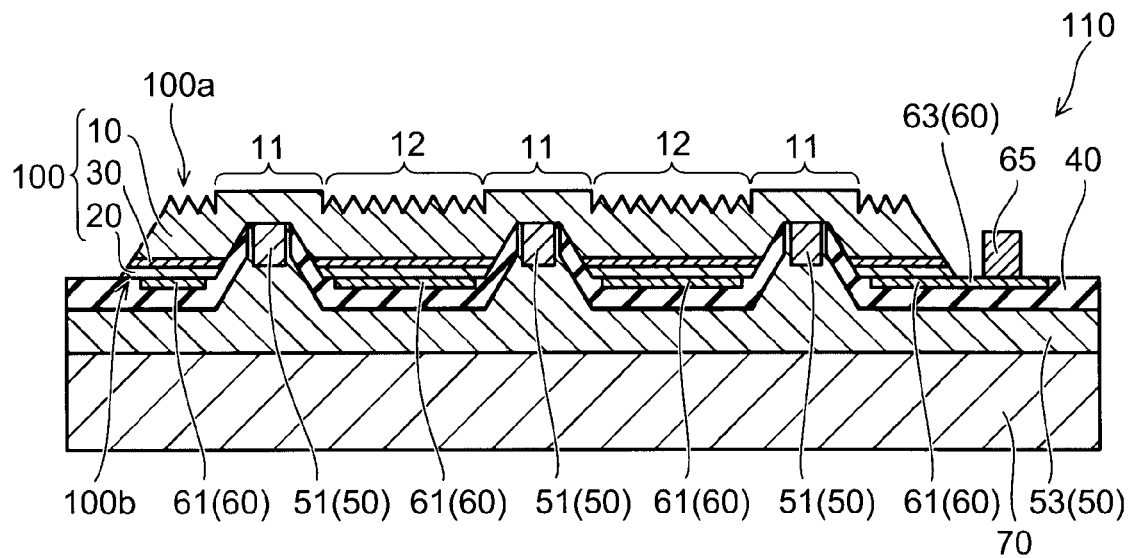
FIGS. 1A and 1B are schematic views showing a semiconductor light emitting device.
Figure 1A:
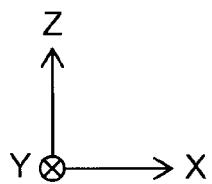

In general, according to one embodiment, a semiconductor light emitting device includes a stacked structure body, a first electrode and a second electrode. The stacked structure body includes a first conductivity type first semiconductor layer, a second conductivity type second semiconductor layer facing a part of the first semiconductor layer, and a light emitting layer provided between the second semiconductor layer and the part of the first semiconductor layer, and has a first major surface on a side of the first semiconductor layer and a second major surface on a side of the second semiconductor layer. The first electrode has a first contact part coming into contact with the first semiconductor layer on a side of the second major surface. The second electrode has a part coming into contact with the second semiconductor layer on the second major surface. The first major surface has a first part having a part overlapping a contact surface with the first semiconductor layer in the first contact part when viewed in a stacking direction from the first semiconductor layer toward the second semiconductor layer and a second part having a part overlapping the second semiconductor layer. The second part has irregularity. A pitch of the irregularity is longer than a peak wavelength of emission light emitted from the light emitting layer. Irregularity of the first part is smaller than the irregularity of the second part.

Various embodiments will be described hereinafter with reference to the accompanying drawings.

The drawings are schematic or conceptual; and the relationships between the thicknesses and widths of portions, the ratio coefficients of sizes among portions, etc., are not necessarily the same as the actual values thereof. Further, the dimensions and the ratio coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
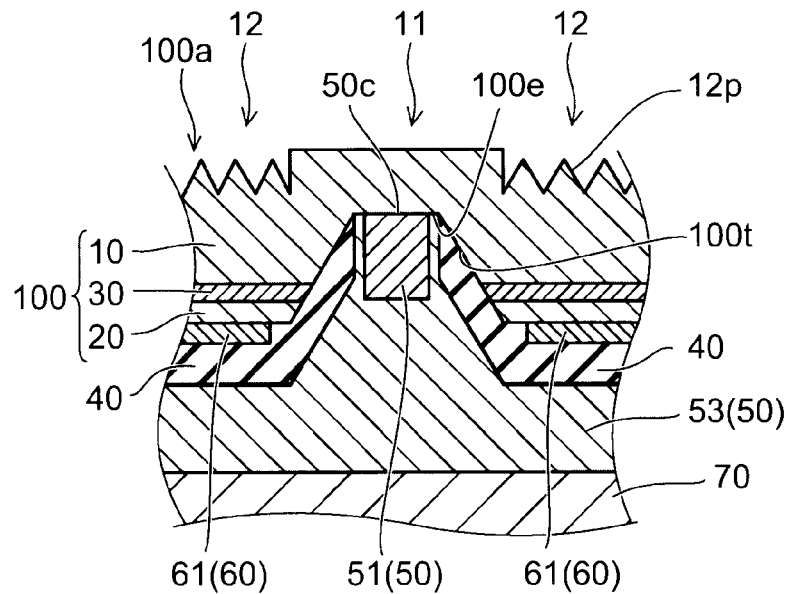

FIGS. 1A and 1B are schematic views illustrating the configuration of a semiconductor light emitting device according to a first embodiment.

Figure 2:
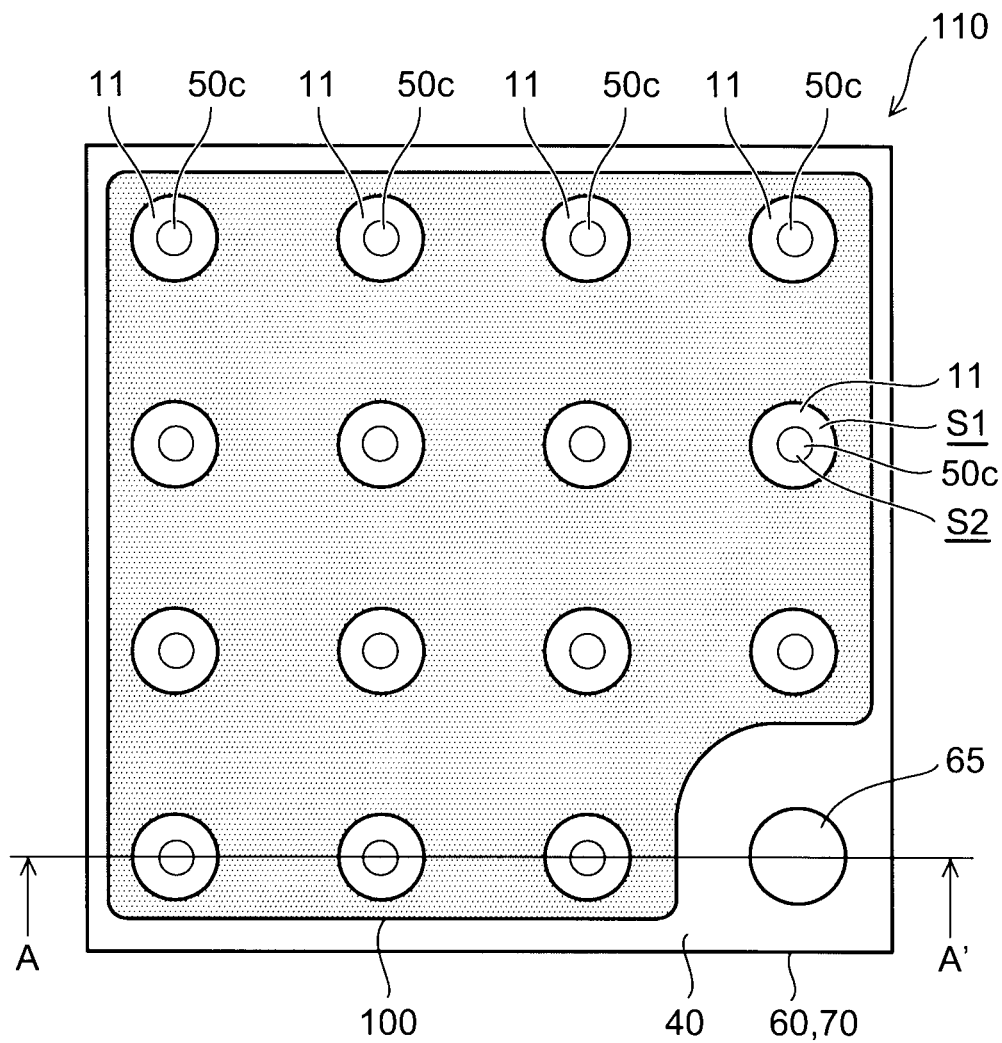
FIG. 2 is a schematic plan view showing the semiconductor light emitting device.

That is, FIG. 1A is a schematic cross-sectional view when viewed in the direction of an A-A' arrow in FIGS. 2 and 1B is a partially enlarged view.

FIG. 2 is a schematic plan view illustrating the configuration of the semiconductor light emitting device according to the first embodiment.

Figure 3A:
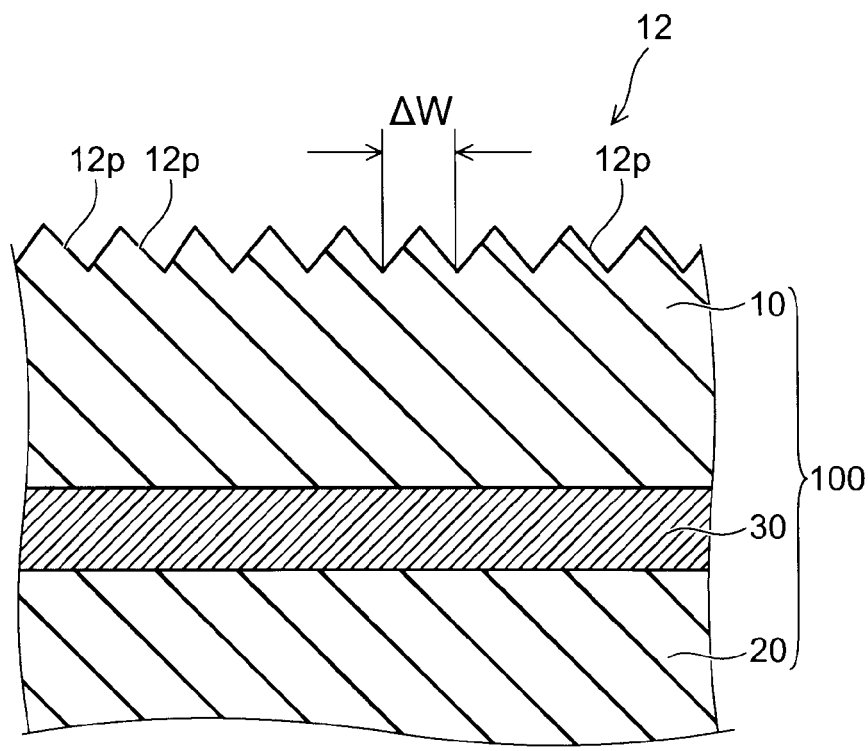
FIGS. 3A and 3B are partially enlarged views of the semiconductor light emitting device.
Figure 3B:
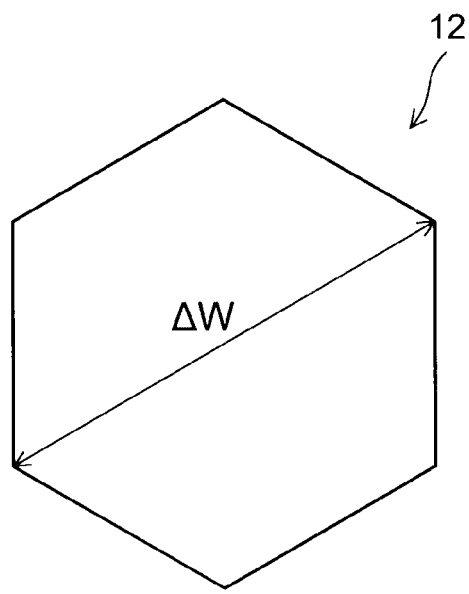

FIGS. 3A and 3B are partially enlarged views of the semiconductor light emitting device according to the first embodiment.

That is, FIG. 3A is a schematic cross-sectional view and FIG. 3B is a schematic plan view.

As shown in FIG. 1A, a semiconductor light emitting device 110 according to the first embodiment comprises a stacked structure body 100, a first electrode 50, and a second electrode 60.

The stacked structure body 100 has a first conductivity type first semiconductor layer 10, a second conductivity type second semiconductor layer 20 facing a part of the first semiconductor layer 10, and a light emitting layer 30 provided between the second semiconductor layer 20 and a part of the first semiconductor layer 10.

The first conductivity type is, for example, an n-type. The second conductivity type is, for example, a p-type. However, the first conductivity type may be a p-type and the second conductivity type may be an n-type. In the embodiment, explanation will be given with a case where the first conductivity type is an n type and the second conductivity type as an example.

The stacked structure body 100 has a first major surface 100a on the side of the first semiconductor layer 10 and a second major surface 100b on the side of the second semiconductor layer 20. In addition, a part of the first semiconductor layer 10 is exposed to the side of the second major surface 100b. This part is an exposed part 100e of the first semiconductor layer 10.

The first electrode 50 has a contact part (first contact part) 51 in contact with the first semiconductor layer 10 at the exposed part 100e. The second electrode 60 is in contact with the second semiconductor layer 20 on the second major surface 100b.

The surface on the side of the first major surface 100a of the first semiconductor layer 10 has a first part 11 and a second part 12.

The first part 11 has a part that overlaps a contact surface 50c with the first semiconductor layer 10 in the contact part 51 of the first electrode 50 when viewed in a direction (stacking direction) from the first semiconductor layer 10 toward the second semiconductor layer 20. Here, in the embodiment, the direction in which the first semiconductor layer 10 and the second semiconductor layer 20 are connected is referred to as a Z-axis direction, one of directions perpendicular to the Z-axis direction is referred to as an X-axis direction, and a direction perpendicular to the Z-axis direction and the X-axis direction is referred to as a Y-axis direction. The stacking direction is the Z-axis direction.

The second part 12 has a part that overlaps the second semiconductor layer 20 when viewed in the stacking direction (Z-axis direction). The second part 12 has irregularity parts 12p. The irregularity of the irregularity parts 12p has a pitch longer than the peak wavelength of emission light emitted from the light emitting layer 30.

The irregularity of the first part 11 is smaller than that of the second part 12. For example, when there is irregularity in the first part 11, the pitch of the irregularity is shorter than the peak wavelength of emission light emitted from the light emitting layer 30.

In such a semiconductor light emitting device 110, the irregularity of the first part 11 is smaller than that of the second part, and thus it is possible to suppress the repetition of reflection of emission light between the contact surface 50c of the first electrode 50 and the first major surface 100a of the first semiconductor layer 10.

Next, a specific example of the semiconductor light emitting device 110 according to the embodiment will be described.

In the semiconductor light emitting device 110 according to the embodiment, the first semiconductor layer 10, the second semiconductor layer 20, and the light emitting layer 30 included in the stacked structure body 100 are, for example, a nitride semiconductor. The first semiconductor layer 10, the second semiconductor layer 20, and the light emitting layer 30 are stacked on a growth substrate such as sapphire using, for example, the organic metal vapor phase epitaxy method.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

As shown in FIG. 1B, the stacked structure body 100 is provided with a recess part 100t that reaches the first semiconductor layer 10 from the second major surface 100b. The bottom surface of the recess part 100t includes the exposed part 100e of the first semiconductor layer 10.

The first electrode 50 has the contact part 51 including the contact surface 50c with the exposed part 100e and a bonding metal part (first bonding metal part) 53 in conduction with the contact part 51 and provided on the side of the second major surface 100b of the stacked structure body 100. The bonding metal part 53 has a part that overlaps the second semiconductor layer 20 when viewed in the stacking direction (the Z-axis direction).

As the contact part 51, a material by which an excellent contact with the first semiconductor layer 10 can be obtained is used. As the contact part 51, for example, an Al/Ni/Au stacked film is used. The stacked film is formed in a thickness of, for example, 300 nm by stacking Al, Ni, and Au in this order from the side of the contact surface 50c.

As the bonding metal part 53, a material by which an excellent connection with a support substrate 70, to be described later, can be obtained is used. As the bonding metal part 53, for example, a Ti/Au stacked film is used. The stacked film is formed in a thickness of, for example, 800 nm by stacking Ti and Au in this order from the side of the second major surface 100b.

The second electrode 60 has a reflection part 61 provided along the second major surface 100b and a leader part 63 that extends to the outside of the stacked structure body 100 from the reflection part 61. As the reflection part 61, a material capable of efficiently reflecting emission light emitted from the light emitting layer 30 is used. As the reflection part 61, for example, a Ag/Pt stacked film is used. The stacked film is formed in a thickness of, for example, 200 nm by stacking Ag and Pt in this order from the side of the second major surface 100b.

The leader part 63 is exposed outside the stacked structure body 100. The leader part 63 is made of the same material as that of, for example, the reflection part 61 and provided integrally. At an exposed part of the leader part 63, a pad 65 is provided.

Between the second electrode 60 and the bonding metal part 53 (the first electrode 50), an insulating layer 40 is provided. The insulating layer 40 is provided from the side of the second major surface 100b of the stacked structure body 100 to the inner surface of the recess part 100t. By the insulating layer 40, the electrical insulation between the first electrode 50 and the second electrode 60 is kept. Furthermore, by covering the light emitting layer 30 that is exposed on the inner surface of the recess part 100t, the light emitting layer 30 is passivated. As the insulating layer 40, for example, $SiO_2$ is used. The thickness of the insulating layer 40 is, for example, 800 nm.

The semiconductor light emitting device 110 is provided with the support substrate 70 that supports the stacked structure body 100 etc. The support substrate 70 is connected to the stacked structure body 100 etc. via the bonding metal part 53. As the support substrate 70, for example, Ge having conductivity is used. The support substrate 70 is bonded to the bonding metal part 53 via solder of, for example, AuSu alloy.

In the semiconductor light emitting device 110, the first electrode 50 is an n-side electrode. Consequently, by the support substrate 70 in conduction with the first electrode 50, electrical conduction between the n-side electrode (the first electrode 50) and the outside is obtained.

In the semiconductor light emitting device 110, the second electrode 60 is a p-side electrode. Consequently, by connecting a bonding wire etc. to the pad 65, electrical conduction between the p-side electrode (the second electrode 60) and the outside is obtained.

As shown in FIG. 2, the semiconductor light emitting device 110 is provided with, for example, a plurality of the first electrodes 50. The plurality of the first electrodes 50 is arranged in the form of a matrix along the X-Y plane when viewed in the Z-axis direction. The number of the first electrodes 50 and their layout are appropriately selected. When the plurality of the first electrodes 50 is provided, the electric current spreads from each of the first electrodes 50 to the second electrode 60, and thus a favorable emission distribution can be obtained in the X-Y plane.

As shown in FIG. 3A, the irregularity parts 12p of the second part 12 are provided with a plurality of protrusions. A maximum width ΔW of the protrusion along the X-axis direction is longer than the peak wavelength in the first semiconductor layer 10 of emission light emitted from the light emitting layer 30.

Herewith, it is possible to regard reflection of emission light at the boundary surface between the first semiconductor layer 10 and the outside as Lambert reflection and the effect to improve light extraction efficiency is magnified. Here, the peak wavelength is a wavelength of light of emission light emitted from the light emitting layer 30, which has the highest intensity. The peak wavelength is a wavelength corresponding to the peak value of the spectral distribution of emission light. When there are two or more local maxima, not the noise level, in spectra, the wavelength of the peak value of any of them may be selected.

As shown in FIG. 3B, for example, a nitride semiconductor is used as the first semiconductor layer 10, if the planar figure of the protrusion when viewed in the Z-axis direction is substantially a hexagon, the maximum width ΔW is the width between the vertexes diagonally opposed each other.

As an example, when the peak wavelength of emission light within the first semiconductor layer 10 is 155 nm, it is possible to obtain the effect to improve light extraction efficiency until the maximum width ΔW of the irregularity parts 12 reaches about 3 μm after exceeding 155 nm. Herewith, it is preferable for the maximum width ΔW of the irregularity parts 12p to be twice or more the peak wavelength of emission light or particularly preferable, ten times or more that.

In such a semiconductor light emitting device 110, neither the n-side electrode nor the p-side electrode is arranged on the side of the first major surface 100a of the stacked structure body 100. Consequently, compared with the case where the electrode is arranged on the side of the first major surface 100a, the light extraction efficiency on the side of the first major surface 100a is improved. Additionally, it is possible to further magnify the effect to improve the light extraction efficiency at the boundary surface between the first semiconductor layer 10 and the outside by the second part 12 provided on the first major surface 100a.

The inventors of the invention have newly found that by providing the first part 11 flatter than the second part 12 on the first major surface 100a, which is one of light extraction surfaces, it is possible to improve light extraction efficiency compared with the case where the first part 11 is not provided.

Here, the above-mentioned knowledge we have newly found will be described by a comparison between the semiconductor light emitting device 110 according to the embodiment and a semiconductor light emitting device according to a reference example as an example.

Figure 4:
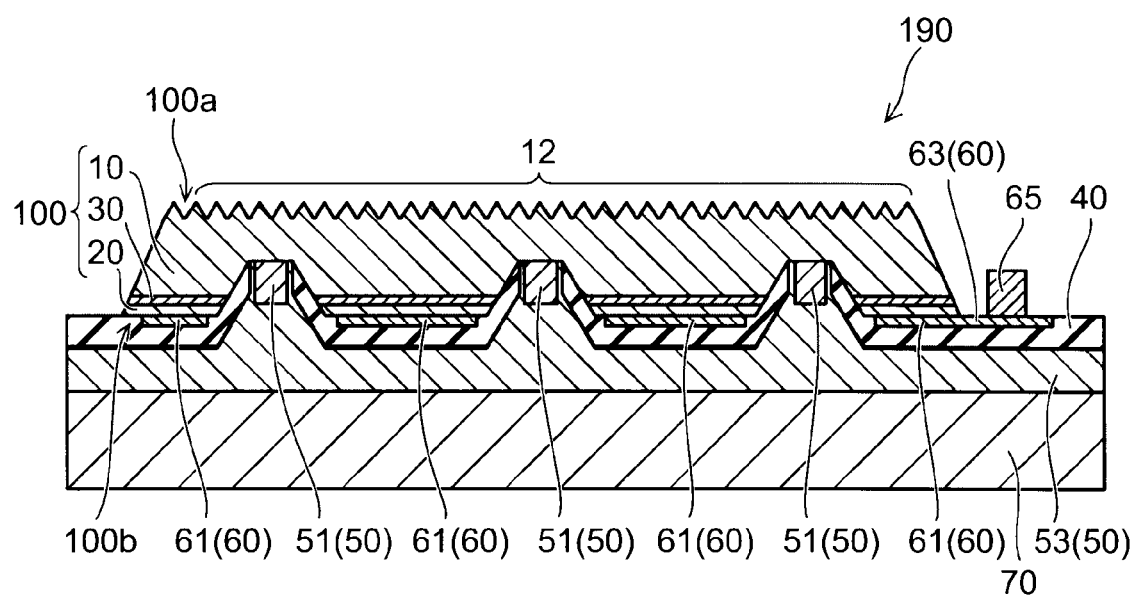
FIG. 4 is a schematic cross-sectional view showing a semiconductor light emitting device according to a reference example.
Figure 4:
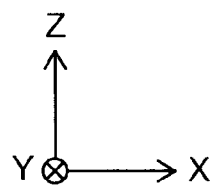

FIG. 4 is a schematic cross-sectional view illustrating the configuration of a semiconductor light emitting device according to the reference example.

As shown in FIG. 4, in a semiconductor light emitting device 190 according to the reference example, only the second part 12 is provided on the first major surface 100a of the first semiconductor layer 10. That is, while the semiconductor light emitting device 110 according to the embodiment comprises the first part 11, the semiconductor light emitting device 190 according to the reference example does not comprise the first part 11.

The inventors of the invention have carried out a simulation of the semiconductor light emitting device 110 provided with the first part 11 as described above and the semiconductor light emitting device 190 not provided with the first part 11 by the finite-difference time-domain method (FDTD method) and calculated light extraction efficiency. As a result of that, a new knowledge that light extraction efficiency can be improved by providing the first part 11 has been found.

Figure 5A:
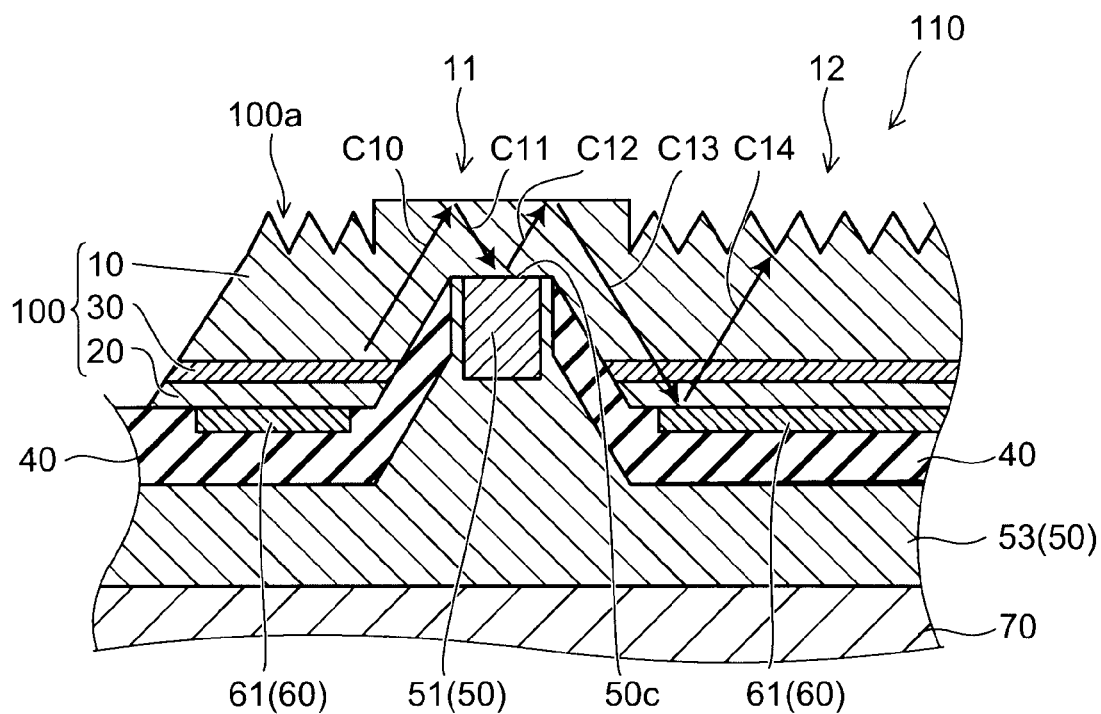
FIG. 5A to FIG. 6 are schematic cross-sectional views showing reflection of emission light.
Figure 5B:
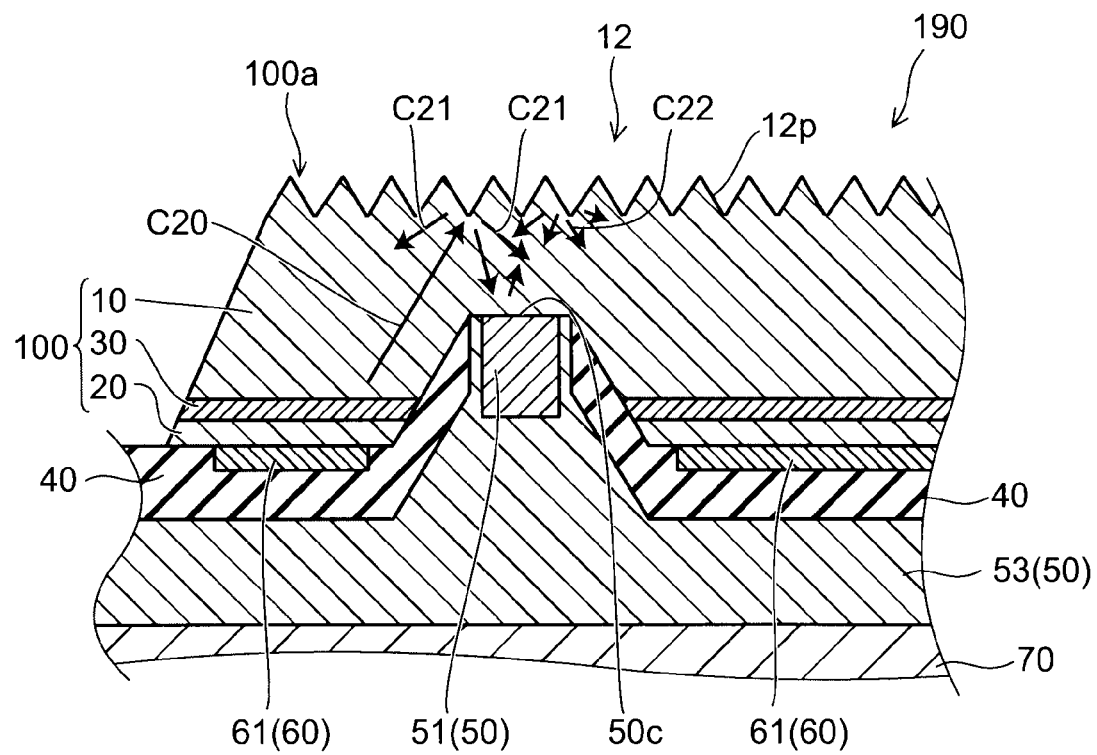
Figure 6:
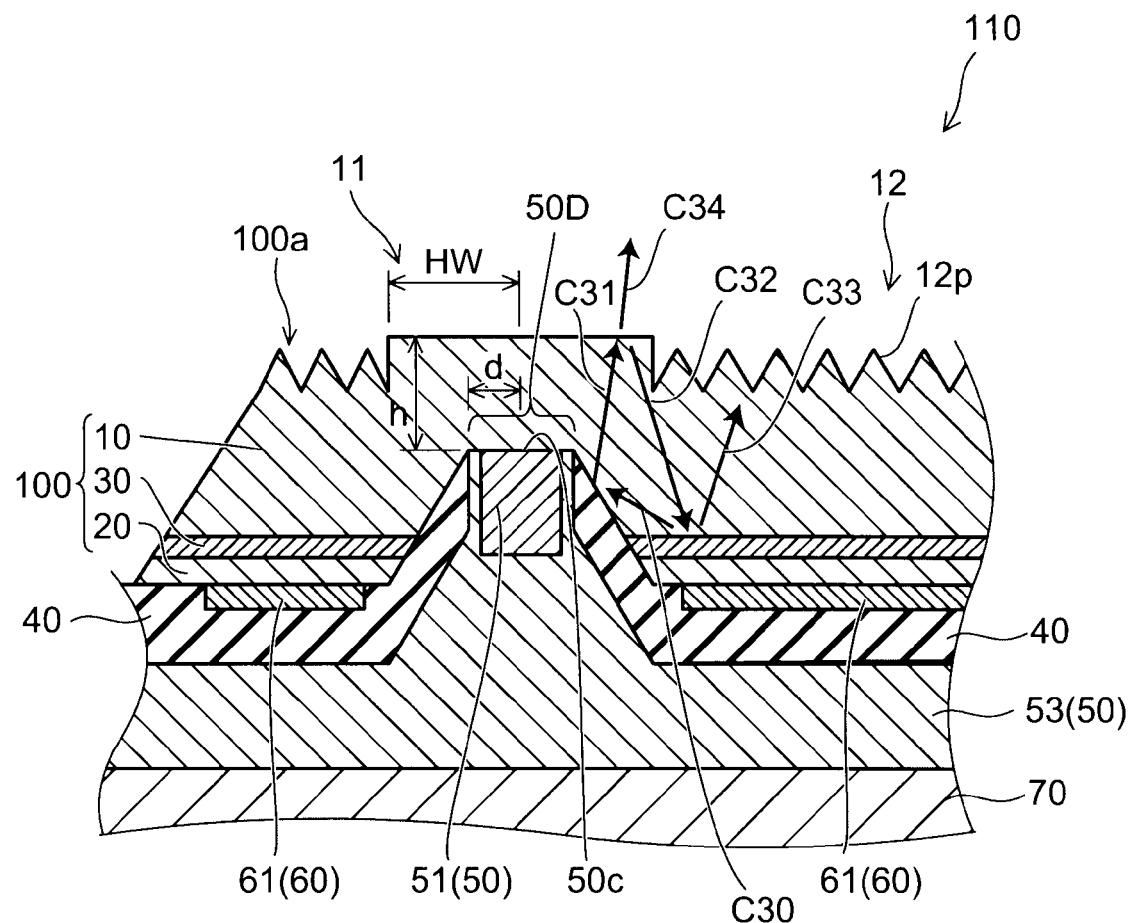

FIG. 5A to FIG. 6 are schematic cross-sectional views illustrating reflection of emission light.

FIG. 5A schematically shows the way of reflection of emission light in the semiconductor light emitting device according to the embodiment. FIG. 5B schematically shows the way of reflection of emission light in the semiconductor light emitting device according to the reference example. FIG. 6 schematically shows the way of another reflection of emission light in the semiconductor light emitting device according to the embodiment. Each of FIGS. 5A, 5B, and 6 schematically shows a state of traveling and reflection of emission light emitted from the light emitting layer 30 at a certain angle.

As shown in FIG. 5B, in the semiconductor light emitting device 190 according to the reference example, emission light C20 emitted toward the first major surface 100a from the light emitting layer 30 is regarded to be reflected by Lambert reflection in terms of statistics. A part of light (light C21) reflected by Lambert reflection from the irregularity parts 12p of the second part 12 is reflected from the contact surface 50c of the first electrode 50 (the contact part 51) and travels again toward the irregularity parts 12p of the second part 12. The light C21 is reflected again by Lambert reflection from the irregularity parts 12p (light C22).

Here, a part of the light C21 by Lambert reflection travels toward the contact surface 50c of the first electrode 50 (the contact part 51). A part of the light C21 toward the contact surface 50c is absorbed by the contact surface 50c and a part of the light is reflected. That is, the light of the emission light C20, which has propagated between the irregularity parts 12p and the contact surface 50c of the first electrode 50 (the contact part 51) repeats Lambert reflection at the irregularity parts 12p and reflection at the contact surface 50c. By this repetition of reflection of light, light is prone to gather between the first major surface 100a and the contact surface 50c of the first electrode 50 (the contact part 51). In the semiconductor light emitting device 190, by such gathering of light, the emission efficiency of emission light to the outside is reduced.

On the other hand, as shown in FIG. 5A, in the semiconductor light emitting device 110 according to the embodiment, emission light C10 emitted from the light emitting layer 30 toward the first major surface 100a is reflected at the first part 11. The reflected light C11 is reflected at the contact surface 50c of the first electrode 50 (the contact part 51) and travels again toward the first part 11 (light C12). The light C11 is reflected again at the first part (light C13). The light C13 travels toward the reflection part 61 of the second electrode 60. Light C14 reflected at the reflection part 61 travels toward the irregularity parts 12p of the second part 12. The light C14 is reflected by Lambert reflection at the irregularity parts 12p of the second part 12 and emitted to the outside.

Here, the first part 11 is flatter compared with the second part 12, and thus scattering of the light C10 incident to the first part 11 is less. Most of the emission light C10 incident to the first part 11 at a predetermined angle is reflected at the first part 11. Herewith, reflection according to geometrical optics is prone to take place between the first major surface 100a and the contact surface 50c of the first electrode 50 (the contact part 51) and the emission light C10 is hard to gather between the first major surface 100a and the contact surface 50c of the first electrode 50 (the contact part 51). That is, in the semiconductor light emitting device 110, the light that has been reflected repeatedly in the gap between the first part 11 and the contact surface 50c quickly passes through the gap and is reflected efficiently at the reflection part 61 of the second electrode 60 and emitted to the outside as a result.

In this case, as the number of times of reflection at the contact surface 50c is reduced, the loss of light is reduced, and thus it is easy to improve the light extraction efficiency. For example, it is possible to reduce the number of times of reflection by reducing the area of the contact surface 50c. Furthermore, as a result of a simulation carried out by the inventors of the invention, it has been found that the intensity distribution inside the stacked structure body 100 of emission light emitted from the light emitting layer 30 has the maximum intensity at an angle inclined by 30 degrees with respect to the light emitting layer 30 when reflection is repeated between the second part 12 and the reflection part 61 of the second electrode 60.

Through the use of this, the conditions of suppressing the loss of light to a minimum by utilizing the above have been obtained. That is, when it is assumed that a flat part 50D (see FIG. 6) including the contact surface 50c and the first part 11 is concentric when viewed in the Z-axis direction, and if the radius of the flat part 50D is d (see FIG. 6) and the thickness of the stacked structure body 100 from the contact surface 50c to the first part 11 is h (see FIG. 6), and then $\tan^{-1}(h/d) > 30$ degrees is met, the light incident to the first part 11 at an angle of 30 degrees can pass through the flat part 50D without entering the contact surface 50c. Herewith, it is possible to suppress the loss of light to a minimum.

Furthermore, as shown in FIG. 6, in the semiconductor light emitting device 110 according to the embodiment, emission light C30 emitted from the light emitting layer 30 toward the inner surface of the recess part 100t is reflected at the inner surface of the recess part 100t. Reflected light C31 is split into light C34 that is extracted to the outside at the first part 11 and light C32 that is reflected. The light C32 travels toward the reflection part 61 of the second electrode 60. Light C33 that is reflected at the reflection part 61 travels toward the irregularity parts 12p of the second part 12. The light C33 is emitted to the outside after reflected at the irregularity parts 12p of the second part 12 by Lambert reflection.

The first part 11 is flatter than the second part 12, and thus scattering of the emission light C3 incident to the first part 11 is less. The emission light C31 incident to the first part 11 at a predetermined angle passes through (C34) or is reflected at (C32) the first part 11. By selecting the angle of the inner surface of the recess part 100t, the light C32 is reflected to the side of the second electrode 60 instead of the side of the contact surface 50c. The light C32 reflected to the side of the second electrode 60 is reflected efficiently at the reflection part 61 of the second electrode 60 and emitted to the outside without entering the contact surface 50c.

In particular, when the angle of the recess part 100t with respect to the first major surface 100a is 60 degrees, the light C31 incident to the inner surface of the recess part 100t at an angle of 30 degrees and reflected enters the first part 11 at an angle of 90 degrees, and thus most of the light of the component is extracted to the outside (C34). Herewith, it is possible to extract emission light to the outside while suppressing to a minimum the light incident to the contact surface 50c at which the loss of light is larger than that of the second electrode 60.

Conditions of a specific simulation are shown below.

The diameter of the contact surface 50c when viewed in the Z-axis direction was set to 10 μm. The contact surfaces 50c were arranged into a square with a pitch of 64 μm. The distance from the contact surface 50c to the first major surface 100a of the first part 11 was set to 6 μm. The distance from the light emitting layer 30 to under the irregularity parts 12p of the second part 12 was set to 4 μm. The maximum height of the irregularity parts 12p formed by alkali processing, to be described later, was set to 1 μm, and the angle of the recess part 100t was set to 75 degrees. The other parameters were regarded as those of a structure, to be described later, and light extraction efficiency was calculated using HW, half the width of the first part 11, as a parameter.

As a result of that, there was a tendency of the light extracting efficiency higher than that of the semiconductor light emitting device 190 according to the reference example to become higher when the width HW exceeded about 9 μm. Meanwhile, it can be considered that the light extraction efficiency is reduced if the width HW is increased more than necessary. With the structure based on the conditions of simulation described above, it was possible to improve the light extraction efficiency by 1.1% compared with the reference example or to reduce the loss of light (=1−light extraction efficiency) by 8.2%.

Here, it is desirable for the outer edge of the first part 11 when viewed in the stacking direction to be larger than the outer edge of the contact surface 50c when viewed in the stacking direction. That is, as shown in FIG. 2, an area S1 of the outline of the first part 11 is made larger than an area S2 of the outline of the contact surface 50c. The shape of the outer edge of the first part 11 is similar to the shape of the outer edge of the contact surface 50c. Herewith, when viewed in the stacking direction, the first part 11 includes the contact surface 50c as a result. By making the area S1 larger than the area S2, it is possible to effectively prevent light from gathering between the first major surface 100a and the contact surface 50c.

The larger the area S1 of the outline of the first part 11, the less the gathering of light becomes. Consequently, if the area S1 of the outline of the first part 11 is made larger, the light extraction efficiency is improved. On the other hand, if the area S1 becomes sufficiently larger than the area S2, the more improvement cannot be expected. Furthermore, if the area S1 is too large, the improvement in the light extraction efficiency because of the irregularity parts 12p provided in the second part 12 is impeded. The outline and the area S1 of the first part 11 are set in view of those described above.

As the contact part 51 of the first electrode 50, a material by which a favorable contact with the first semiconductor layer 10 can be obtained is used. On the other hand, as the reflection part 61 of the second electrode 60, a material capable of favorably reflecting emission light is used. Depending on the difference in material, there may be a case where the reflectance to emission light of the contact surface 50c is lower than the reflectance to emission light of the reflection part 61. When the reflectance of the contact surface 50c is lower than the reflectance of the reflection part 61, in the semiconductor light emitting device 190 according to the reference example shown in FIG. 5B, the influence of the loss of light because of the gathering of light between the contact surface 50c and the first major surface 100a becomes significant.

On the contrary, in the semiconductor light emitting device 110 according to the embodiment shown in FIG. 5A, at the first part 11, reflection of the emission light C10 and C30 according to geometrical optics is prone to occur and even when the reflectance of the contact surface 50c is low, it is possible to guide emission light to the second part 12 with a minimum number of times of reflection to the contact surface 50c or without entering the contact surface 50c. As a result of that, in the semiconductor light emitting device 110, it is possible to improve the emission efficiency of emission light to the outside compared with in the case of the semiconductor light emitting device 190.

Next, an example of a method for manufacturing the semiconductor light emitting device 110 will be described.

FIG. 7A to FIG. 9B are schematic cross-sectional views for describing an example of the method for manufacturing the semiconductor light emitting device in order.

Figure 7A:
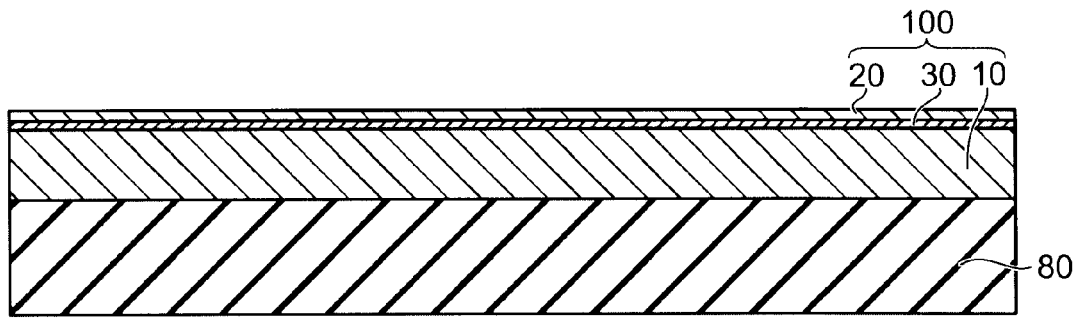
FIG. 7A to FIG. 9B are schematic cross-sectional views showing a method for manufacturing the semiconductor light emitting device.

First, as shown in FIG. 7A, on a growth substrate 80 made of sapphire etc., crystal is grown sequentially in order of the first semiconductor layer 10, the light emitting layer 30, and the second semiconductor layer 20. By this, the stacked structure body 100 is formed on the growth substrate 80.

The stacked structure body 100 is formed by using, for example, the organic metal vapor phase epitaxy method. As an example, the stacked structure body 100 is formed as follows.

First, on the growth substrate 80 the surface of which is made of a sapphire c surface, as a buffer layer, a high carbon concentration first AlN buffer layer (for example, the carbon concentration is $3 \times 10^{18}$ cm$^{-3}$ or more and $5 \times 10^{20}$ cm$^{-3}$ or less and the thickness is, for example, 3 nm or more and 20 nm or less), a high purity second AlN buffer layer (for example, the carbon concentration is $1 \times 10^{16}$ cm$^{-3}$ or more and $3 \times 10^{18}$ cm$^{-3}$ or less and the thickness is 2 μm), and a non-doped GaN buffer layer (for example, the thickness is 2 μm) are formed in this order. The first AlN buffer layer and the second AlN buffer layer are a single crystal aluminum nitride layer. By using a single crystal aluminum nitride layer as the first and second AlN buffer layers, it is possible to form a semiconductor layer of high quality in the crystal growth, to be described later, and damage to the crystal is reduced considerably.

Next, a Si-doped n-type GaN contact layer (for example, the Si concentration is $1 \times 10^{18}$ cm$^{-3}$ or more and $5 \times 10^{19}$ cm$^{-3}$ or less and the thickness is 6 μm) and a Si-doped n-type $Al_{0.10}Ga_{0.90}N$ clad layer (for example, the Si concentration is $1 \times 10^{18}$ cm$^{-3}$ and the thickness is 0.02 μm) are formed thereon in this order. The Si-doped n-type GaN contact layer and the Si-doped n-type $Al_{0.10}Ga_{0.90}N$ clad layer are the first semiconductor layer 10. It should be noted that for the sake of convenience, all of or a part of the GaN buffer layers may be included in the first semiconductor layer 10.

Here, the buffer layer formed on the growth substrate 80 is not limited to the above-mentioned AlN. For example, as the buffer layer, a low-temperature grown $Al_xGa_{1-x}N$ ($0 \leq x \leq 1$) thin film may be used.

Next, as the light emitting layer 30, a Si-doped n-type $Al_{0.11}Ga_{0.89}N$ barrier layer and a GaInN well layer are stacked thereon alternately in three cycles and furthermore, a final $Al_{0.11}Ga_{0.89}N$ barrier layer of the multi quantum well is stacked. In the Si-doped n-type $Al_{0.11}Ga_{0.89}N$ barrier layer, the Si concentration is set to, for example, $1.1 \times 10^{19}$ cm$^{-3}$ or more and $1.5 \times 10^{19}$ cm$^{-3}$ or less. In the final $Al_{0.11}Ga_{0.89}N$ barrier layer, the Si concentration is set to, for example, $1.1 \times 10^{19}$ cm$^{-3}$ or more and $1.5 \times 10^{19}$ cm$^{-3}$ or less and the thickness is set to, for example, 0.01 μm. The thickness of such a multi quantum well structure is set to, for example, 0.075 μm. After this, a Si-doped n-type $Al_{0.11}Ga_{0.89}N$ layer (for example, the Si concentration is $0.8 \times 10^{19}$ cm$^{-3}$ or more and $1.0 \times 10^{19}$ cm$^{-3}$ or less and the thickness is set to, for example, 0.01 μm) is formed. It should be noted that the wavelength of emission light in the light emitting layer 30 is, for example, 370 nm or more and 480 nm or less, or 370 nm or more and 400 nm or less.

Furthermore, as the second semiconductor layer 20, a non-doped $Al_{0.11}Ga_{0.89}N$ spacer layer (for example, the thickness is 0.02 μm), a Mg-doped p-type $Al_{0.28}Ga_{0.72}N$ clad layer (for example, the Mg concentration is $1 \times 10^{19}$ cm$^{-3}$ and the thickness is, for example, 0.02 μm), a Mg-doped p-type GaN contact layer (for example, the Mg concentration is $1 \times 10^{19}$ cm$^{-3}$ and the thickness is 0.4 μm), and a high concentration Mg-doped p-type GaN contact layer (for example, the Mg concentration is $5 \times 10^{19}$ cm$^{-3}$ a and the thickness is, for example, 0.02 μm) are formed sequentially in this order.

It should be noted that the above-mentioned compositions, composition ratios, kinds of impurities, impurity concentrations, and thicknesses are examples and there can be various modifications.

Meanwhile, by setting the Mg concentration of the high concentration Mg-doped p-type GaN contact layer to about $1 \times 10^{20}$ cm$^{-3}$, somewhat higher, it is possible to improve the ohmic characteristics with the second electrode 60. However, in the case of a semiconductor light emitting diode, there is a concern of deterioration in the characteristics by Mg diffusion because the distance between the high concentration Mg-doped p-type GaN contact layer and the light emitting layer 30 is short, unlike in the case of a semiconductor laser diode. Herewith, by suppressing the Mg concentration of the high concentration Mg-doped p-type GaN contact layer to about $1 \times 10^{19}$ cm$^{-3}$ without considerably degrading the electrical characteristics by making use of the large contact area between the second electrode 60 and the high concentration Mg-doped p-type GaN contact layer and the low current density at the time of operation, it is possible to prevent Mg diffusion and to improve emission characteristics.

Furthermore, the high carbon concentration first AlN buffer layer functions to relax the difference in the crystal type from the growth substrate 80 and, in particular, to reduce the screw dislocation. The surface of the high purity second AlN buffer layer is flattened at the atomic level. Herewith, the crystal defects of the non-doped GaN buffer layer that grows thereon are reduced. It should be noted that it is preferable to set the film thickness of the second AlN buffer layer greater than 1 μm in order to sufficiently reduce crystal defects. In addition, it is desirable to set the film thickness to 4 μm or less in order to prevent a warp due to distortion. The high purity second AlN buffer layer is not limited to AlN and $Al_xGa_{1-x}N$ ($0.8 \leq x \leq 1$) may be used and it is possible to compensate for the warp of the growth substrate 80.

Moreover, the non-doped GaN buffer layer grows in the shape of a three-dimensional island on the high purity second AlN buffer. Herewith, the non-doped GaN buffer layer functions to reduce crystal defects. It is desirable to set the average film thickness of the non-doped GaN buffer layer to 2 μm or more in order to flatten the growth surface. From the viewpoint of reproducibility and reduction in warp, it is preferable for the total film thickness of the non-doped GaN buffer layer to be 2 μm or more and 10 μm or less.

By adopting these buffer layers, it is possible to reduce the crystal defects to about 1/10 compared with the case where the low-temperature grown AlN buffer layer is adopted. By this technique, it is possible to manufacture a highly-efficient semiconductor light emitting device despite the high concentration Si doping to the n-type GaN contact layer and ultraviolet band emission. Furthermore, by reducing the crystal defects in the non-doped GaN buffer layer, the absorption of light in the non-doped GaN buffer layer is also suppressed.

Figure 7B:
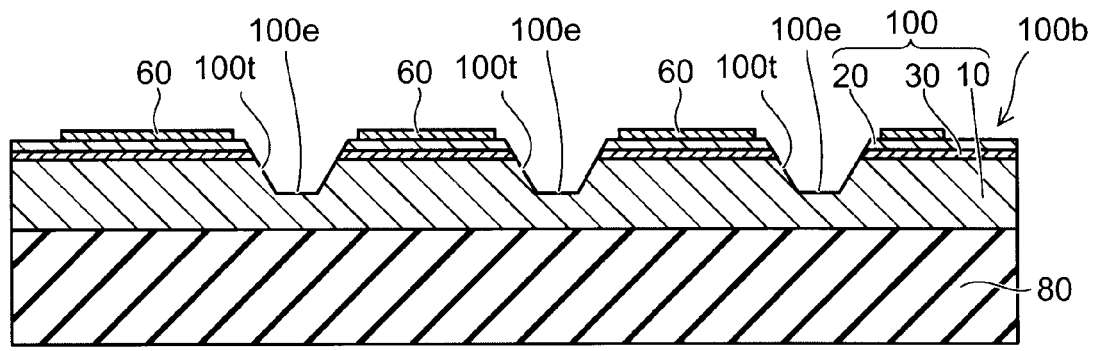

Next, as shown in FIG. 7B, the recess part 100t is formed in a part of the stacked structure body 100. The recess part 100t reaches the first semiconductor layer 10 from the second major surface 100b of the stacked structure body 100. Herewith, the first semiconductor layer 10 is exposed on the bottom part of the recess part 100t (the exposed part 100e).

In order to form the recess part 100t, a mask, not shown schematically, is formed on the second major surface 100b of the stacked structure body 100 and, for example, dry etching is performed. That is, the mask is provided with an opening in the part where the recess part 100t is formed and by etching, the stacked structure body 100 is removed from the second major surface 100b to the first semiconductor layer 10. Herewith, the recess part 100t is formed. The angle of the inner surface of the recess part 100t is not limited in particular, but it is preferable to set 60 degrees or more as the angle at which light at an angle of 30 degrees from the light emitting layer 30, the emission light of which has the maximum intensity, is reflected in the opposite direction of the direction in which the light travels.

Next, the second electrode 60 that comes into contact with the second semiconductor layer 20 is formed. To form the second electrode 60, first, on the surface of the second semiconductor layer 20, a Ag/Pt stacked film, which forms an ohmic electrode, is formed in a film thickness of, for example, 200 nm and sinter processing is performed for one minute at about 400° C. in an oxygen atmosphere. Next, on the ohmic electrode, for example, a Ti/Au/Ti stacked is formed in a film thickness of, for example 400 nm as a current diffusion metal, a bonding metal to the pad 65, to be described later, and an adhesion metal to the insulating layer 40, to be described later.

Here, the second electrode 60 includes at least Ag or Ag alloy. The reflection efficiency to the visible light band of the normal metal single layer film tends to reduce for shorter wavelengths in the ultraviolet band of 400 nm or less. Ag has high reflection efficiency characteristics also to light in the ultraviolet band of 370 nm or more and 400 nm or less. Herewith, in the case of the semiconductor light emitting device of ultraviolet emission and where the second electrode 60 is an alloy including Ag, it is desirable for the second electrode 60 on the side of the semiconductor boundary surface to have a larger component ratio of Ag. It is preferable for the film thickness of the second electrode 60 to be 100 nm or more to secure the reflection efficiency to light.

Figure 7C:
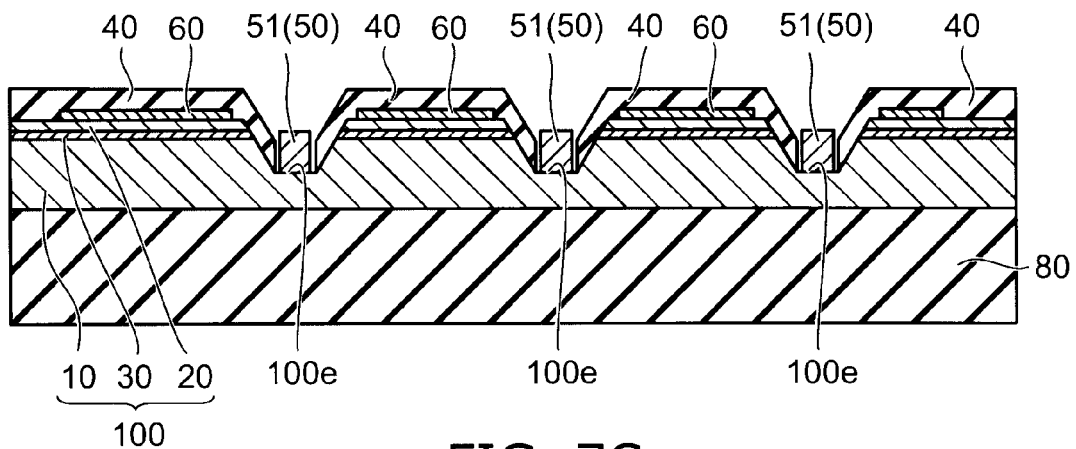

Next, as shown in FIG. 7C, the insulating layer 40 is formed so as to cover the second electrode 60 and the recess part 100t. As the insulating layer 40, for example, $SiO_2$ is formed into a film in a film thickness of 800 nm.

Next, in order to form an n-side electrode having the ohmic characteristics, the insulating layer 40 on the exposed part 100e within the recess part 100t is removed. Then, for example, an Al/Ni/Au stacked film is formed thereon in a film thickness of, for example, 300 nm. Herewith, the contact part 51 is formed.

If, for example, Al is used as the first layer of the contact part 51, favorable ohmic characteristics and low contact characteristics with the n-type contact layer are obtained. Moreover, the contact part 51 can function as a reflection electrode, and thus by using Al as the first layer, the light extraction efficiency and the degree of freedom of design of the n-side electrode are improved. Al has a low resistance to environment, and thus for example, by adopting an Al alloy including a small amount of Si, it is possible to improve reliability and adhesiveness. It should be noted that the material of the contact part 51 is not limited to the above. For example, in order to obtain lower contact characteristics, it may also be possible to form a Ti/Al/Ni/Au stacked film in a film thickness of, for example, 320 nm and perform sinter processing for one minute at 600° C. in a nitrogen atmosphere. In that case, it is sufficient to form the n-side electrode before the second electrode 60 and add a process of opening a hole in the insulating layer 40 on the n-side electrode after forming the insulating layer 40.

Figure 8A:
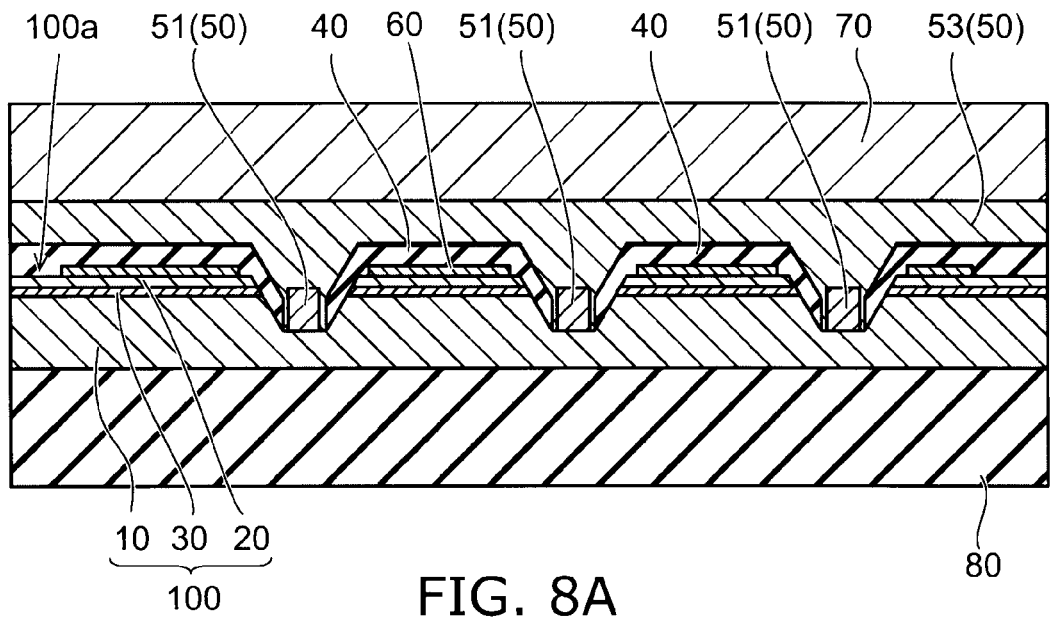

Next, as shown in FIG. 8A, on the entire surface on which the contact part 51 and the insulating layer 40 are exposed, for example, a Ti/Au stacked film is formed in a film thickness of 800 nm as the bonding metal part 53.

Next, the support substrate 70 made of, for example, Ge is prepared. On the major surface of the support substrate 70, solder (not shown schematically) of AuSn alloy having a film thickness of, for example, 3 μm is provided. Then, the metal bonding part 53 and the solder arranged facing each other and heated to temperature equal to or higher than the eutectic point of the solder, for example, 300° C. By this, the support substrate 70 is bonded to the side of the second major surface 100b of the stacked structure body 100.

Figure 8B:
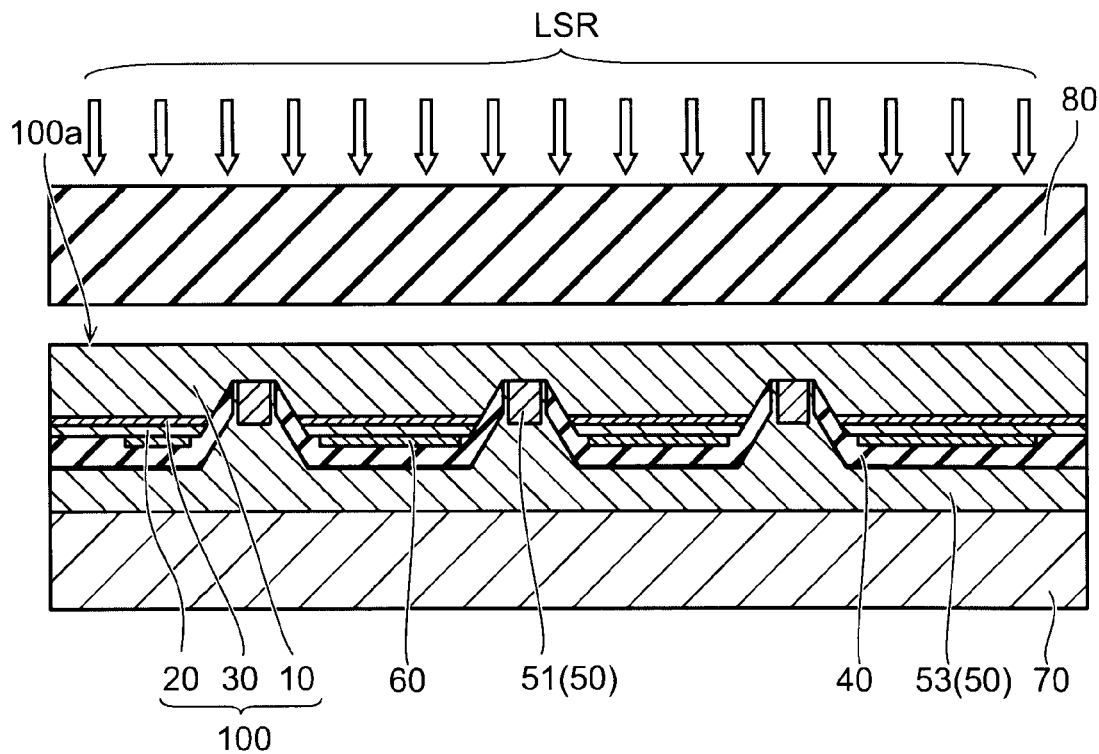

Then, as shown in FIG. 8B, the stacked structure body 100 is irradiated with laser light LSR of the triple harmonics (355 nm) or quadruple harmonics (266 nm) of the solid-state laser of, for example, $YVO_4$ from the side of the growth substrate 80. The laser light LSR has a wavelength shorter than the forbidden bandwidth wavelength based on the forbidden bandwidth of GaN of the GaN buffer layer (for example, the above-mentioned non-doped GaN buffer layer). That is, the laser light LSR has energy higher than that of the forbidden bandwidth of GaN.

The laser light LSR is absorbed efficiently in the region of the GaN buffer layer (the non-doped GaN buffer layer) on the side of the single crystal AlN buffer layer (in this example, the second AlN buffer layer). Herewith, GaN of the GaN buffer layer on the side of the single crystal AlN buffer layer is decomposed by heat generation.

Here, in the process of causing the stacked structure body 100 on the growth substrate 80 and the support substrate 70 to adhere to each other and the process of peeling off the growth substrate 80 by decomposing GaN with laser light, there is a possibility that the influence of crystal defects etc. is exerted on the stacked structure body 100. That is, there is a possibility that the stacked structure body 100 is affected by the difference in the thermal expansion coefficient between the support substrate 70 and the growth substrate 80 or GaN, heat generated by local heating, products caused by decomposition of GaN, etc.

In the embodiment, a single crystal AlN buffer layer is used as the AlN buffer layer and thus, it is possible to form the stacked structure body 100 of high quality. Herewith, it is possible to considerably reduce the occurrence of defects etc. in crystal.

A single crystal AlN buffer layer has high thermal conduction characteristics. Herewith, at the time of decomposition of GaN by laser light, heat diffuses to the AlN buffer layer close to GaN and it is unlikely to suffer from damage due to local heating.

Then, the decomposed GaN is removed by hydrochloric acid processing etc. and the growth substrate 80 is peeled off from the stacked structure body 100. Herewith, the growth substrate 80 and the stacked structure body 100 are separated.

Next, the formation of irregularity and of the pad 65 is carried out on the first major surface 100a of the exposed stacked structure body 100.

Figure 9A:
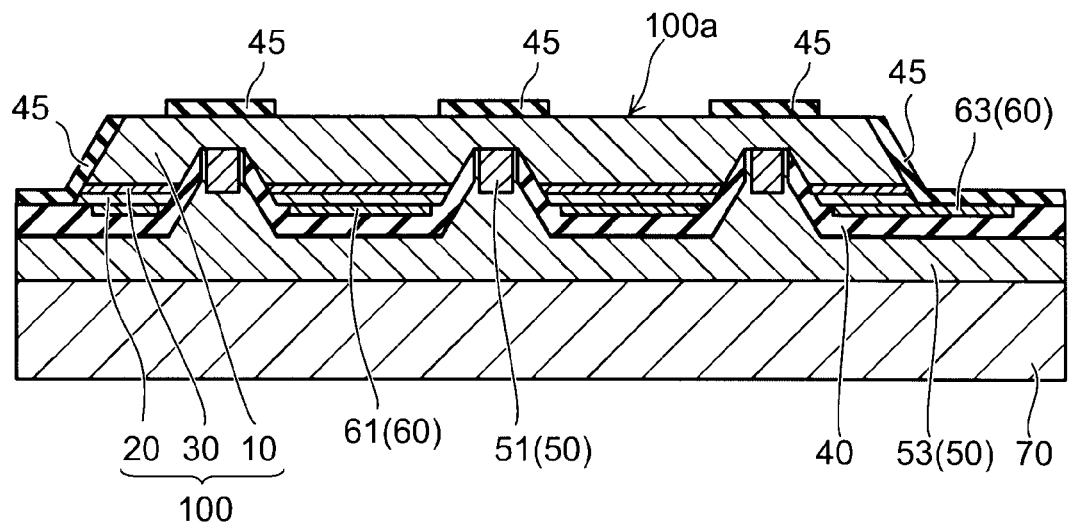

First, as shown in FIG. 9A, a part of the stacked structure body 100 is removed by dry etching and part (the leader part 63) of the second electrode 60 is exposed. Next, a dielectric 45 is formed on the entire surface of the first major surface 100a of the stacked structure body 100 and an opening is provided in a part thereof. As the dielectric 45, for example, $SiO_2$ is used. The film thickness of the dielectric 45 is, for example, 800 nm. From the opening of the dielectric 45, for example, the surface of the non-doped GaN buffer layer is exposed.

Figure 9B:
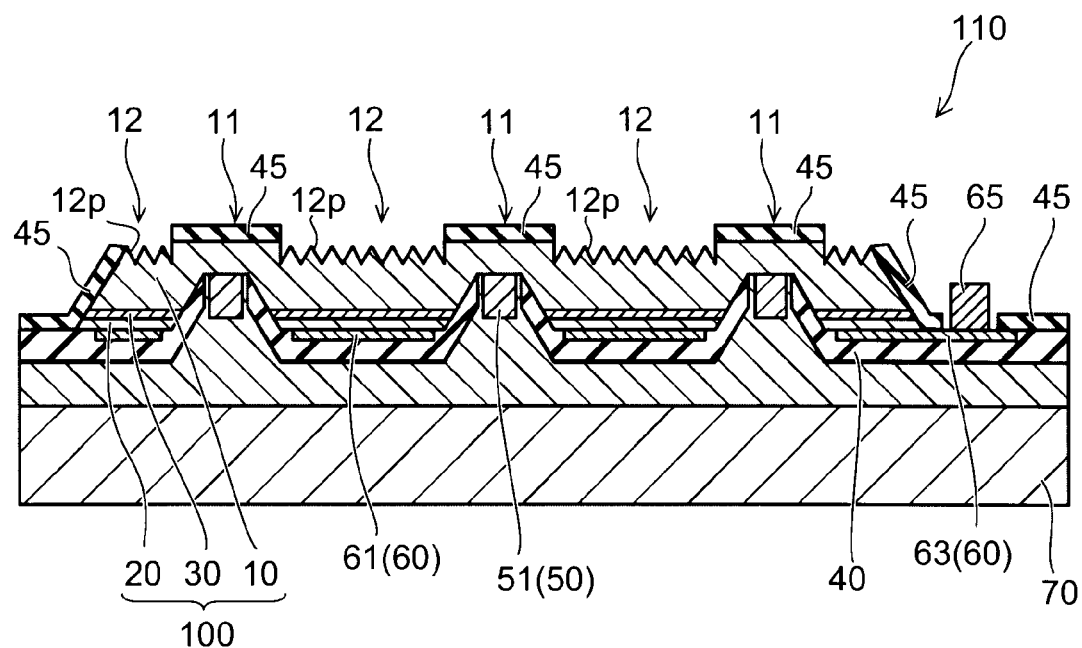

Next, as shown in FIG. 9B, by using the dielectric 45 in which an opening is provided as a mask, the surface of the non-doped GaN buffer layer is processed by, for example, alkali etching using a KOH solution and thus the irregularity parts 12p are formed. Etching conditions are, for example, that one mol/litter (L) KOH solution is heated to 80° C. and etching is performed for 20 minutes. After that, the dielectric 45 that remains on the first part 11 may be removed.

In this manner, the irregularity parts 12p are formed in the part of the dielectric 45 where openings are formed. That is, the second part 12 including the irregularity parts 12p is formed. On the other hand, in the part where the dielectric 45 is provided, the irregularity parts 12p are not formed. That is, the part where the dielectric 45 is provided on the first major surface 100a forms the first part 11 flatter than the second part 12. The first part 11 and the second part 12 may be formed in the Si-doped n-type GaN contact layer.

Here, as a method for forming the irregularity parts 12p, either wet etching described above or dry etching may be used. By alkali etching using a KOH solution etc., anisotropic etching is performed along the surface orientation (mainly, {10-1-1}) of the GaN crystal and a hexagonal pyramid structure is formed as a result. Furthermore, the etching rate, the size and density of the hexagonal pyramid considerably vary depending on the etching temperature, etching time, hydrogen ion exponent (pH) adjusted by adding another substance, concentration, presence/absence of irradiation of ultraviolet (UV) light and UV laser, etc.

In general, the larger the amount of etching (the depth from the surface before etching to the deepest part of the irregularity parts 12p formed after etching), the larger and the more densely the irregularity parts 12p are formed. When processing GaN by dry etching, unlike the Ga surface, the N surface is susceptible to crystal orientation and transition, and anisotropic etching is likely to take place. The surface of GaN grown on the c surface sapphire substrate is normally the Ga surface and in the embodiment, the surface of GaN exposed by removing the sapphire substrate is the N surface. Consequently, it is easy to form the irregularity parts 12p by anisotropic etching of dry etching. Moreover, it may also be possible to form the irregularity parts 12p by dry etching using a mask. Herewith, the irregularity parts 12p can be formed exactly according to design, and thus it is easy to improve the light extraction efficiency.

The irregularity parts 12p are formed to, for example, effectively extract incident emission light or to change the incidence angle. Herewith, it is preferable for the size to be equal or more than the wavelength of emission light in the crystal layer. If the irregularity parts 12p are smaller than the wavelength of emission light, the emission light incident to the irregularity parts 12p exhibits behaviors, such as scattering and diffraction, at the boundary surface of the irregularity parts 12p, which are described by wave optics. Herewith, a part of the emission light that originally passes through cannot be extracted any more. Furthermore, if the irregularity parts 12p are sufficiently smaller than the wavelength of the emission light, the irregularity parts 12p are regarded as a layer in which the refractive index varies continuously. Herewith, the irregularity parts 12p become equivalent to a flat surface without irregularity, and thus light extraction efficiency is not improved.

The results of the experiment using a semiconductor light emitting device with an emission light wavelength of 390 nm (the emission wavelength in the crystal layer is about 155 nm) manufactured in the embodiment showed the tendency that the larger the irregularity parts 12p, the more the light output increases. The tendency to increase continued until the size of the irregularity parts 12p became about 3 μm. Herewith, it has been found that preferably the size of the irregularity parts 12p is twice or more the emission wavelength in the crystal layer and more preferably, ten times or more.

Then, a part of the dielectric 45 that covers the leader part 63 is removed and the pad 65 is formed in that region. As the pad 65, for example, a Ti/Au stacked film is used. The film thickness of the pad 65 is, for example, 800 nm. To the pad 65, a bonding wire is connected. In order to improve bonding characteristics, it is desirable to form Au thick on the surface of the pad 65 by, for example, plating.

After that, the dielectric 45 is removed and the support substrate 70 is cut by cleavage or using a diamond blade etc. according to the necessity. Herewith, the semiconductor light emitting device 110 is completed.

As described above, when making use of anisotropic etching using an alkali solution such as KOH to form the irregularity parts 12p, the etching rate changes depending on slight fluctuation in structure and charged state. Herewith, it is difficult to control the amount of etching. When forming the irregularity parts 12p on the first major surface 100a on the contact surface 50c as in the semiconductor light emitting device 190 according to the reference example shown in FIG. 4, it is necessary to design the thickness of the first semiconductor layer 10 on the contact surface 50c so as to be great to a certain degree in view of the degree of margin of the amount of etching. Herewith, much emission light propagates to a gap between the contact surface 50c and the first major surface 100a as a result, and thus the light extraction efficiency is reduced more.

On the other hand, in the semiconductor light emitting device 110 of the embodiment, in which the irregularity parts 12p are not provided on the first major surface 100a on the contact surface 50c, it is possible to design the thickness of the first semiconductor layer 10 on the contact surface 50c to be small. Herewith, a structure is obtained in which it is hard for emission light to enter the gap between the contact surface 50c and the first major surface 100a.

Furthermore, in the stacked structure body 100, the above-mentioned gap is the thinnest part in the structure. By not providing the irregularity parts 12p in this part, it is possible to improve mechanical strength of the semiconductor light emitting device 110.

In the manufacturing method described above, after forming the irregularity parts 12p, the dielectric 45 on the first part 11 shown in FIG. 9B is removed, but it may also be possible to leave and not remove the dielectric 45 on the first part 11. By doing so, it is possible to omit the process of removing the dielectric 45 and to make an attempt to simplify the manufacturing process. Furthermore, it is possible to improve the electrical characteristics, light extracting efficiency, and reliability by covering the region in which the second semiconductor layer 20 and the light emitting layer 30 are removed to prevent the n-side electrode from being damaged by chemical processing such as alkali processing through a through transition included within the first semiconductor layer 10.

Second Embodiment

Figure 10A:
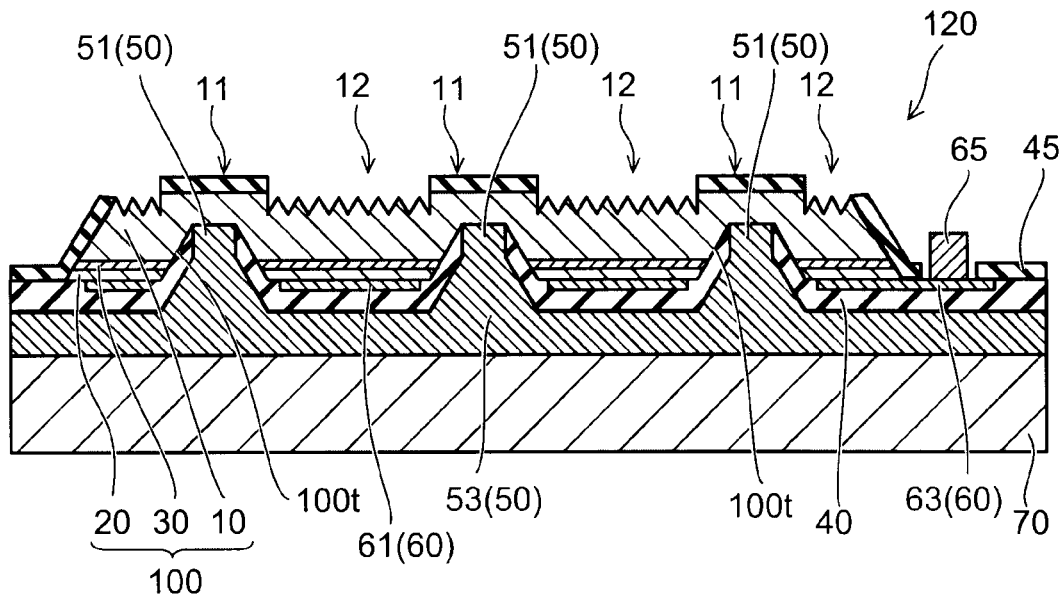
FIG. 10A to FIG. 13 are schematic cross-sectional views showing semiconductor light emitting devices.
Figure 10B:
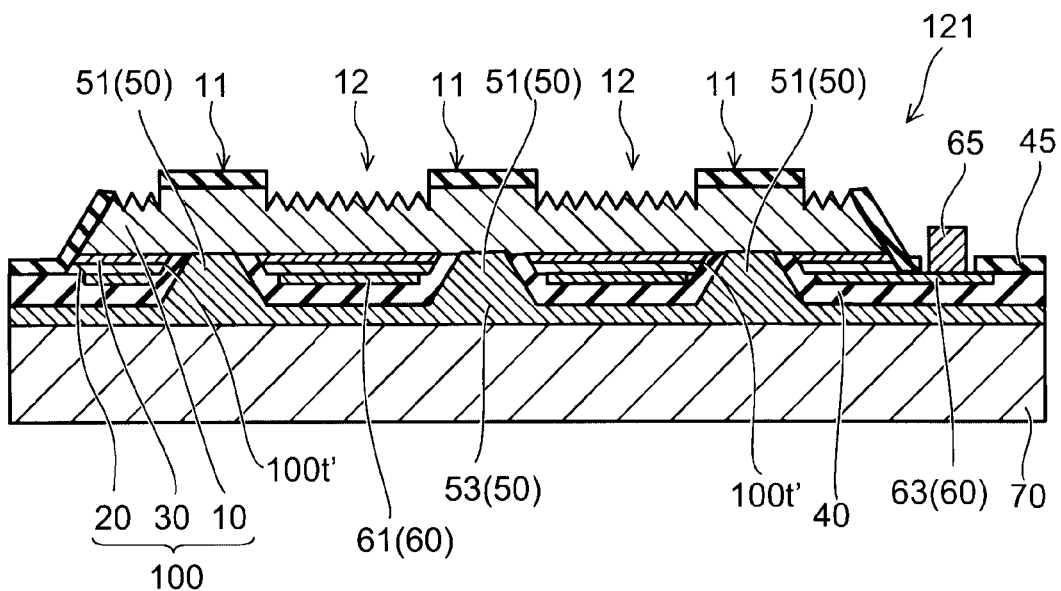

FIGS. 10A and 10B are schematic cross-sectional views illustrating the configuration of semiconductor light emitting devices according to a second embodiment.

That is, FIG. 10A illustrates a semiconductor light emitting device (I) according to the second embodiment and FIG. 10B illustrates a semiconductor light emitting device (II) according to the second embodiment.

As shown in FIGS. 10A and B, in semiconductor light emitting devices 120 and 121, the contact part 51 and the bonding metal part 53 in the first electrode 50 are provided integrally.

That is, in the semiconductor light emitting devices 120 and 121, the contact part 51 and the bonding metal part 53 are formed integrally by the same material. As the contact part 51 and the bonding metal part 53, for example, a material including Al is used.

The semiconductor light emitting device 120 shown in FIG. 10A differs from the semiconductor light emitting device 121 shown in FIG. 10B in the depths of the recess part 100$t$ and a recess part 100$t'$ provided in the stacked structure body 100. The recess part 100$t$ of the semiconductor light emitting device 120 is the same as the recess part 100$t$ of the semiconductor light emitting device 110. The first electrode 50 in which the contact part 51 and the bonding metal part 53 are provided integrally is embedded in the recess part 100$t$ and at the same time, formed along the second major surface 100$b$ on the side of the second major surface 100$b$ via the insulating layer 40.

The recess part 100$t'$ of the semiconductor light emitting device 121 shown in FIG. 10B is shallower than the recess part 100$t$. That is, the bottom part of the recess part 100$t'$ is provided in the vicinity of the boundary between the light emitting layer 30 and the first semiconductor layer 10. By making the recess part 100$t'$ shallower, it becomes easier to embed the first electrode 50. It is also possible to reduce the thickness of the first electrode 50 and to make an attempt to thin the whole of the semiconductor light emitting device 121.

Third Embodiment

Figure 11A:
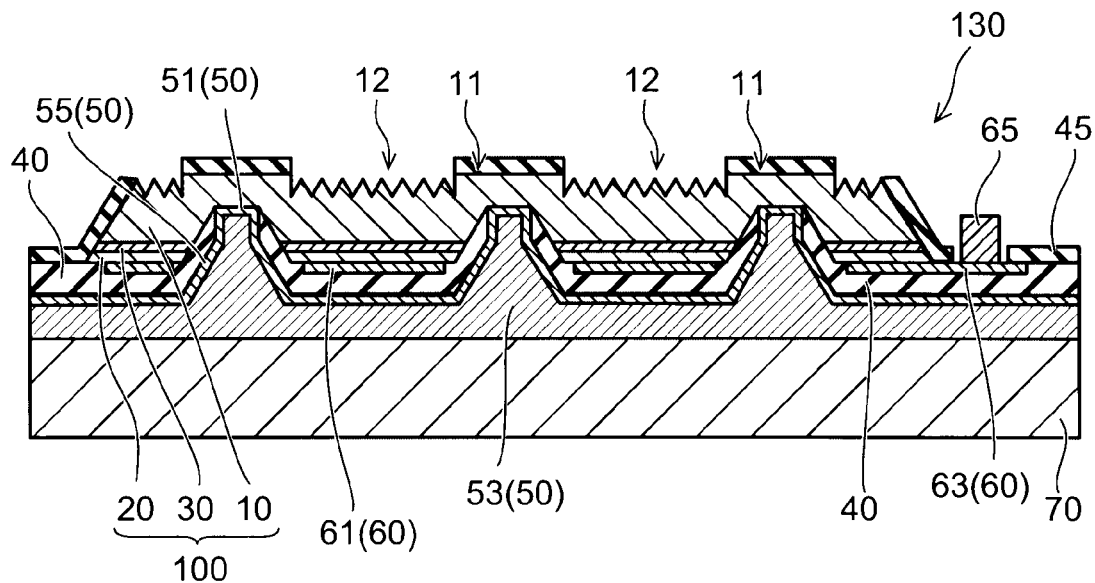
Figure 11B:
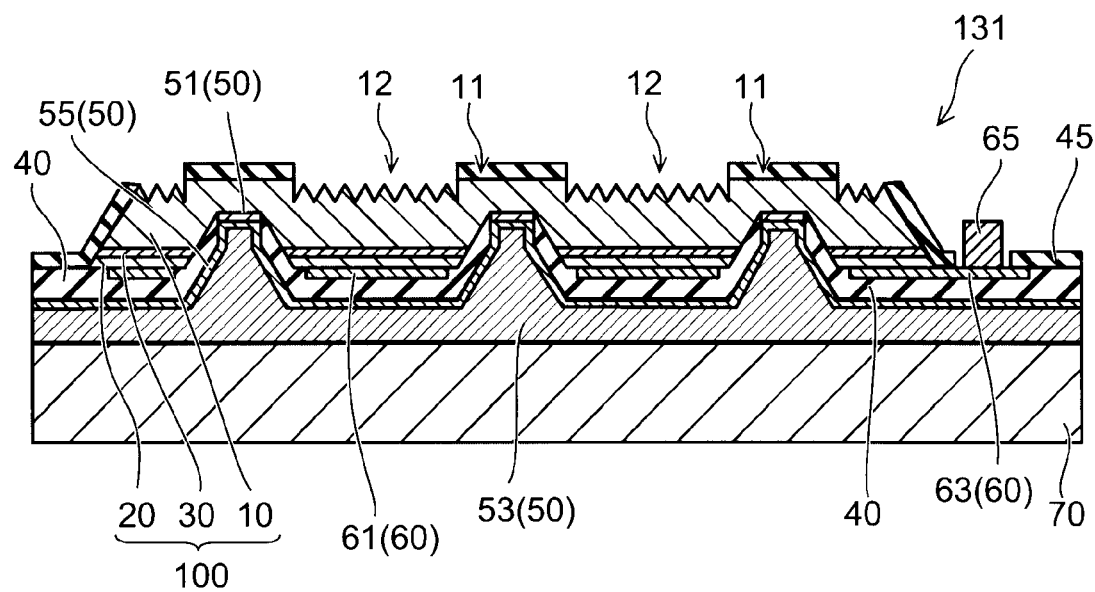

FIGS. 11A and 11B are schematic cross-sectional views illustrating the configuration of a semiconductor light emitting device according to a third embodiment.

That is, FIG. 11A illustrates a semiconductor light emitting device (I) according to the third embodiment and FIG. 11B illustrates a semiconductor light emitting device (II) according to the third embodiment.

As shown in FIGS. 11A and 11B, in semiconductor light emitting devices 130 and 131, as the first electrode 50, an intermediate metal layer 55 is provided between the bonding metal part 53 and the insulating layer 40.

In the semiconductor light emitting device 130 shown in FIG. 11A, the intermediate metal layer 55 is provided so as to extend along the insulating layer 40 from the contact part 51. The contact part 51 is a part of the intermediate metal layer 55. The bonding metal part 53 is provided via the intermediate metal layer 55. As the intermediate metal layer 55, a material by which favorable contact with the first semiconductor layer 10 and the bonding metal part 53 can be obtained is used.

The intermediate metal layer 55 is formed so as to cover the insulating layer 40 and an exposed part 100$e$ after forming the insulating layer 40 and an opening in the exposed part 100$e$ as shown in FIG. 7C. After that, the bonding metal part 53 is formed on the intermediate metal layer 55.

In the semiconductor light emitting device 131 shown in FIG. 11B, a part of the intermediate metal layer 55 is in contact with the contact part 51. The intermediate metal layer 55 is provided so as to extend along the insulating layer 40 from the contact position with the contact part 51. The bonding metal part 53 is provided via the intermediate metal layer 55. As the intermediate metal layer 55, a material by which favorable contact with the contact part 51 and the bonding metal part 53 can be obtained is used.

The intermediate metal layer 55 is formed so as to cover the insulating layer 40 and the contact part 51 after forming the contact part 51 as shown in FIG. 7C. After that, the bonding metal part 53 is formed on the intermediate metal layer 55.

In the semiconductor light emitting devices 130 and 131, the intermediate metal layer 55 is provided, and thus it is made possible to improve electrical conduction and mechanical bonding between the contact part 51 and the bonding metal part 53.

Fourth Embodiment

Figure 12:
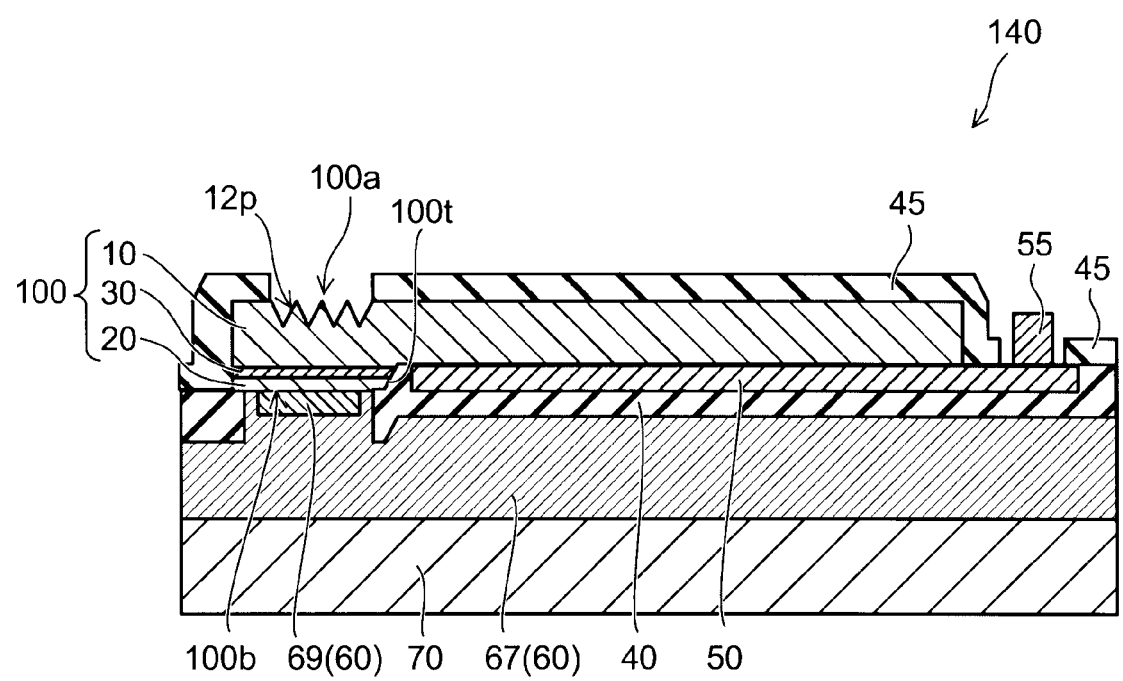
Figure 13:
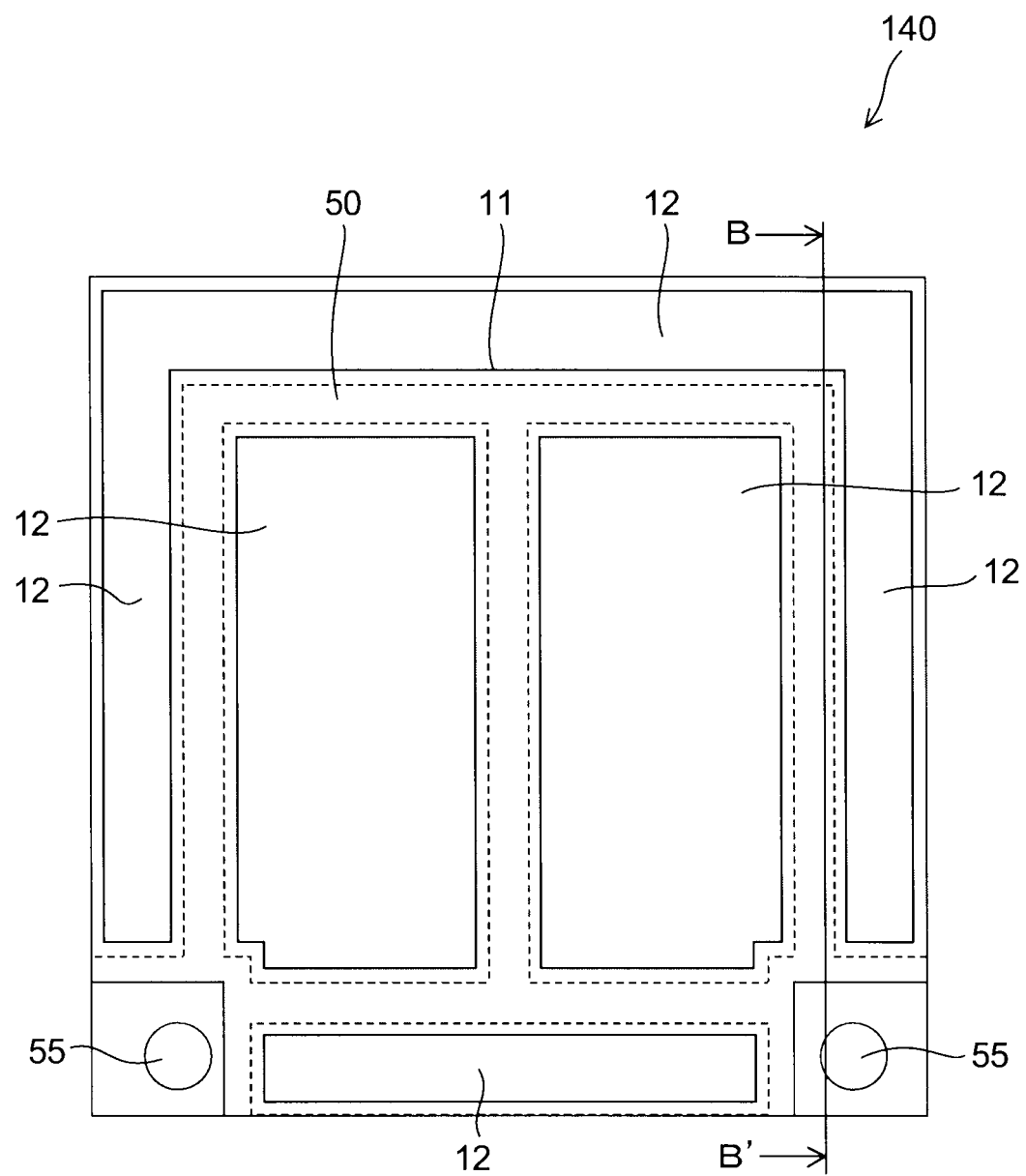

FIGS. 12 and 13 are schematic cross-sectional views illustrating the configuration of a semiconductor light emitting device according to a fourth embodiment.

FIG. 12 is a schematic cross-sectional view when viewed in the direction of a B-B' arrow in FIG. 13.

FIG. 13 is a schematic plan view of a semiconductor light emitting device according to the fourth embodiment.

As shown in FIG. 12 and FIG. 13, in a semiconductor light emitting device 140 according to the embodiment, the second electrode 60 has a bonding metal part (second bonding metal part) 67, which is a part of the second electrode 60, and a contact part (second contact part) 68 that comes into contact with the second semiconductor layer 20 of the stacked structure body 100 on the support substrate 70.

In the recess part 100$t$ in the second major surface 100$b$ of the stacked structure body 100, the first electrode 50 is provided. The first electrode 50 extends to the outside of the stacked structure body 100 and part thereof is exposed. On the exposed part, the pad 55 is provided.

A part of the bonding metal part 67 of the second electrode 60 overlaps the first electrode 50. Between the bonding metal part 67 and the first electrode 50, the insulating layer 40 is provided. In the embodiment, the side of the first electrode 50, which comes into contact with the first semiconductor layer 10, is referred to as a contact part (first contact part). Meanwhile, in FIG. 13, the schematic representation of the dielectric 45 is omitted.

An example of a method for manufacturing the semiconductor light emitting device 140 as described above will be described.

First, the stacked structure body 100 is formed on the growth substrate 80. This is the same as that in the first embodiment.

Next, the recess part 100$t$ is formed in a part of the stacked structure body 100. The recess part 100$t$ reaches the first semiconductor layer 10 from the second major surface 100$b$ of the stacked structure body 100. Herewith, the first semiconductor layer 10 is exposed on the bottom part of the recess part 100$t$.

Next, the first electrode 50 that comes into contact with the first semiconductor layer 10 is formed. As the first electrode 50, first, a Ti/Al/Ni/Au stacked film, which forms an ohmic electrode, is formed in a film thickness of, for example, 300 nm on the surface of the exposed first semiconductor layer 10 and sinter processing is performed for five minutes at 600° C. in a nitrogen atmosphere. Next, on the ohmic electrode, as the bonding metal for electric current diffusion and to the pad and the adhesion metal to the insulating layer, for example, a Ti/Au/Ti stacked film is formed in a film thickness of, for example, 400 nm.

Next, the insulating layer 40 is formed so as to cover the first electrode 50 and the recess part 100t. As the insulating layer 40, for example, $SiO_2$ is formed into a film in a thickness of 800 nm.

Next, in order to form a p electrode having the ohmic characteristics, the insulating layer 40 on the second semiconductor layer 20 is removed. Then, a Ag/Pt stacked film, which forms an ohmic electrode, is formed thereon in a film thickness of, for example, 200 nm and sinter processing is performed for one minute at 400° C. in an oxygen atmosphere, and thus, the contact part 69 of the second electrode 60 is formed.

Next, on the entire surface on which the contact part 69 and the insulating layer 40 are exposed, as the bonding metal part 67, for example, a Ti/Pt/Au stacked film is formed in a film thickness of, for example, 800 nm.

Next, the support substrate 70 made of, for example, Ge is prepared. On the major surface of the support substrate 70, for example, solder (not shown schematically) of AuSn alloy in a film thickness of 3 μm is provided. Then, the bonding metal part 67 and the solder are arranged facing each other and heated to a temperature equal to or higher than the eutectic point of the solder, for example 300° C. Herewith, the support substrate 70 is bonded to the side of the second major surface 100b of the stacked structure body 100.

Then, the stacked structure body 100 is irradiated with the laser light LSR of triple harmonics (355 nm) or quadruple harmonics (266 nm) of the solid-state laser of, for example, $YVO_4$ from the side of the growth substrate 80.

Then, by hydrochloric acid processing etc., the decomposed GaN is removed and the growth substrate 80 is peeled off from the stacked structure body 100. Herewith, the growth substrate 80 and the stacked structure body 100 are separated.

Next, the formation of irregularity and of the pad 65 is carried out on the first major surface 100a of the stacked structure body 100.

First, a part of the stacked structure body 100 is removed by dry etching and a part of the first electrode 50 (the leader part 63) is exposed. Next, on the entire surface of the first major surface 100a of the stacked structure body 100, the dielectric 45 is formed and an opening is provided in part thereof. As the dielectric 45, for example, $SiO_2$ is used. The film thickness of the dielectric 45 is, for example, 800 nm. From the opening of the dielectric 45, for example, the surface of the non-doped GaN buffer layer is exposed.

Next, using the dielectric 45 in which the opening is provided as a mask, the surface of the non-doped GaN buffer layer is processed by alkali etching using, for example, a KOH solution and the irregularity parts 12p are formed. As the etching conditions, for example, 1 mol/L KOH solution is heated to 80° C. and etching is performed for 20 minutes. After that, the dielectric 45 left on the first part 11 may be removed.

As described above, in the part of the dielectric 45, in which the opening is provided, the irregularity parts 12p are formed. That is, the second part 12 including the irregularity parts 12p is formed. On the other hand, in the part in which the dielectric 45 is provided, the irregularity parts 12p are not provided. That is, the part of the first major surface 100a, on which the dielectric 45 is provided, forms the first part 11 flatter than the second part 12. It should be noted that the first part 11 and the second part 12 may be provided in the Si-doped n-type GaN contact layer.

Then, a part of the dielectric 45 that covers the leader part is removed and the pad 55 is formed in that region. As the pad 55, for example, a Ti/Pt/Au stacked film is used. The film thickness of the pad 65 is, for example, 800 nm. To the pad 55, a bonding wire is connected. It is desirable to form Au thick (for example, 10 μm) by, for example, plating, on the surface of the pad 55 in order to improve bonding characteristics.

After that, the support substrate 70 is cut by cleavage or using a diamond blade etc. according to the necessity. Herewith, the semiconductor light emitting device 140 is completed.

In the semiconductor light emitting device 140 according to the fourth embodiment, the second electrode 60 and the support substrate 70 are connected via a metal layer, and thus heat generated in the light emitting layer 30 is dissipated to the support substrate 70 via the metal layer. Herewith, heat dissipation characteristics are excellent and the thermal resistance is low, and thus it is possible to suppress a rise in temperature caused by an increase in electric current. Herewith, it is possible to increase power to be applied to each device and to simplify the heat dissipating material, and thus it is made possible to reduce the size, weight, and cost of the semiconductor light emitting apparatus using the semiconductor light emitting device 140.

It is necessary for the insulating layer 40 formed as an interlayer insulating layer between the first electrode 50 and the second electrode 60 to cover the whole of the metal layer (the second electrode 60 in the first embodiment, the first electrode 50 in the fourth embodiment). When there is a step in the metal layer, more excellent coverage for the metal layer is obtained by forming the dielectric film at as high a temperature as possible.

Furthermore, in the semiconductor light emitting device 140 according to the fourth embodiment, the insulating layer 40, which forms the interlayer insulating layer, is formed in the first electrode 50 having been subjected to sinter processing at a comparatively high temperature, and thus it is possible to form the dielectric film at a sufficiently high temperature. Herewith, a wide design margin can be secured for coverage, and thus it is possible to improve yields and to reduce the cost.

Figure 14:
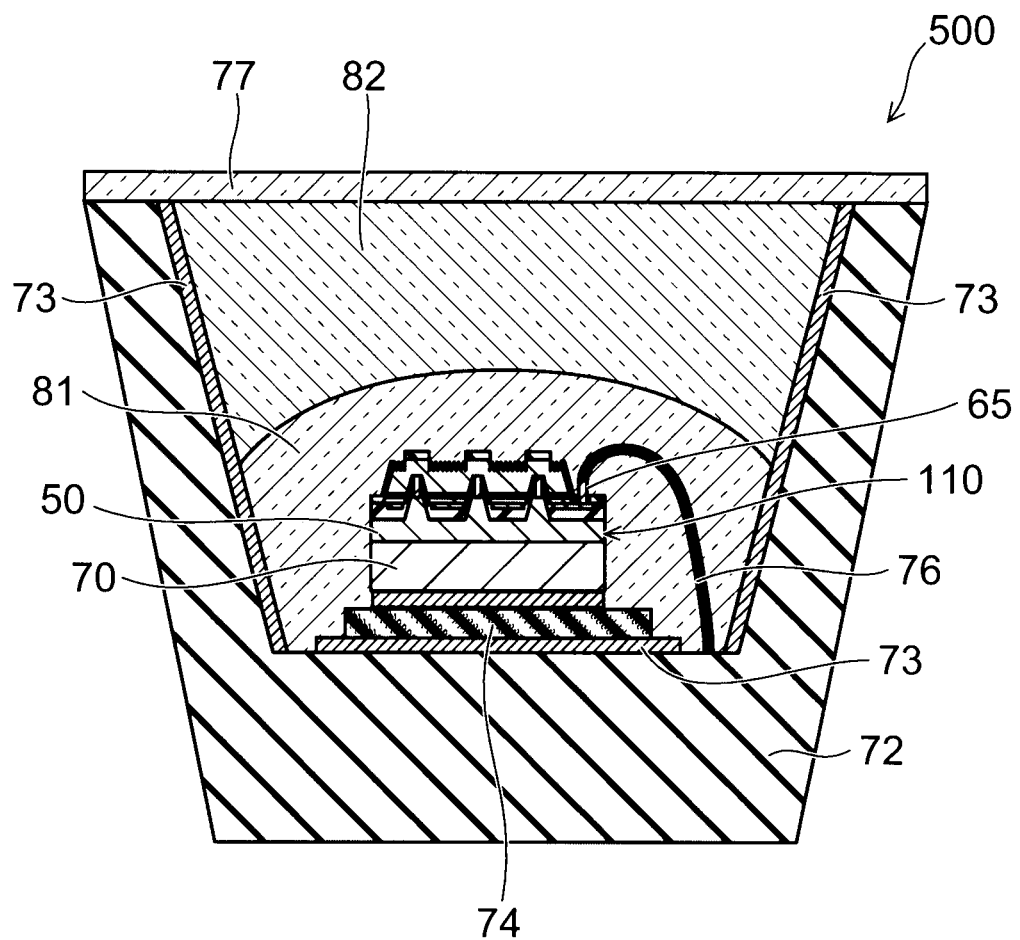
FIG. 14 is a schematic cross-sectional view showing a semiconductor light emitting apparatus.

FIG. 14 is a schematic cross-sectional view illustrating the configuration of a semiconductor light emitting apparatus using the semiconductor light emitting device according to the embodiment.

In the specific example, the semiconductor light emitting device 110 according to the first embodiment is used, but in the semiconductor light emitting apparatus, the semiconductor light emitting devices 120, 121, 130, and 131 according to the other embodiments can also be used.

A semiconductor light emitting apparatus 500 is a white LED that combines the semiconductor light emitting device 110 and a fluorescent material. That is, the semiconductor light emitting apparatus 500 according to the embodiment comprises the semiconductor light emitting device 110 and the fluorescent material that absorbs light emitted from the semiconductor light emitting device 110 and emits light having a wavelength different from that of the light.

As shown in FIG. 14, in the semiconductor light emitting apparatus 500 according to the embodiment, a reflection film 73 is provided on the inner surface of a vessel 72 made of ceramic etc. The reflection film 73 is provided separately on the inner surface and the bottom surface of the vessel 72. The reflection film 73 is made of, for example, aluminum. On the reflection film 73 provided on the bottom part of the vessel 72, the semiconductor light emitting device 110 is installed via a submount 74.

The side of the first major surface 100a of the semiconductor light emitting device 110 faces upward and the back surface of the support substrate 70 is fixed on the submount 74 using, for example, low temperature solder. It is also possible to use an adhesive to fix the semiconductor light emitting device 110, the submount 74, and the reflection film 73.

On the surface of the submount 74 on the side of the semiconductor light emitting device 110, an electrode 75 is provided. The support substrate 70 of the semiconductor light emitting device 110 is mounted on the electrode 75. Herewith, the electrode 75 is brought into conduction with the first electrode 50 via the support substrate 70. The pad 65 is connected to an electrode, not shown schematically, provided on the side of the vessel 72 by a bonding wire 76. The connection is made at the part between the reflection film 73 on the inner surface and the reflection film 73 on the bottom surface.

Furthermore, a first fluorescent material layer 81 including a red fluorescent material is provided so as to cover the semiconductor light emitting device 110 and the bonding wire 76. On the first fluorescent material layer 81, a second fluorescent material layer 82 including a blue, green, or yellow fluorescent material is formed. On the fluorescent material layer, a lid part 77 made of silicone resin etc. is provided.

The first fluorescent material layer 81 includes a resin and a red fluorescent material dispersed in the resin.

As a red fluorescent material, for example, $Y_2O_3$, $YVO_4$, $Y_2(P, V)O_4$ can be used as a base material and trivalent Eu ($Eu^{3+}$) is included therein as an activator. That is, it is possible to use $Y_2O_3:Eu^{3+}$, $YVO_4:Eu^{3+}$, etc., as a red fluorescent material. The concentration of $Eu^{3+}$ can be set to 1% to 10% in mol concentration.

As the base material of the red fluorescent material, LaOS, $Y_2(P, V)O_4$, etc., can be used in addition to $Y_2O_3$, $YVO_4$. Furthermore, $Mn^{4+}$ etc. can also be used in addition to $Eu^{3+}$. In particular, by adding a small amount of Bi along with trivalent Eu to the $YVO_4$ base material, the absorption of 380 nm is increased, and thus it is possible to further increase light emission efficiency. Furthermore, as a resin, for example, a silicone resin can be used.

The second fluorescent material layer 82 includes a resin and at least any of blue, green, and yellow fluorescent materials dispersed in the resin. For example, it may also be possible to use a fluorescent material that combines a blue fluorescent material and a green fluorescent material, a fluorescent material that combines a blue fluorescent material and a yellow fluorescent material, and a fluorescent material that combines a blue fluorescent material, a green fluorescent material, and a yellow fluorescent material.

As the blue fluorescent material, for example, $(Sr, Ca)_{10}(PO_4)_6Cl_2:Eu^{2+}$ and $BaMg_2Al_{16}O_{27}:Eu^{2+}$ can be used As a green fluorescent material, for example, $Y_2SiO_5:Ce^{3+}$ with trivalent Tb as an emission center, $Tb^{3+}$ can be used. In this case, energy is transferred from Ce ions to Tb ions, and thus the excitation efficiency is improved. As a green fluorescent material, for example, $Sr_4Al_{14}O_{25}:Eu^{2+}$ can be used.

As a yellow fluorescent material, for example, $Y_3Al_5:Ce^{3+}$ can be used.

As a resin, for example, a silicone resin can be used. In particular, trivalent Tb exhibits sharp emission in the vicinity of 550 nm at which the visual sensitivity is at its maximum, and thus, if combined with sharp red emission of the trivalent Eu, the emission efficiency is improved remarkably.

According to the semiconductor light emitting apparatus 500 according to the embodiment, ultraviolet light having a wavelength of, for example, 380 nm, generated from the semiconductor light emitting device 110 is emitted in the upward and lateral directions of the semiconductor light emitting device 110. Furthermore, by the ultraviolet light reflected from the reflection film 73, the above-mentioned fluorescent material included in each of the fluorescent material layers is excited efficiently. For example, the above-mentioned fluorescent material with the trivalent Eu included in the first fluorescent material layer 81 as an emission center is converted into light having a narrow wavelength distribution in the vicinity of 620 nm. Herewith, it is possible to efficiently obtain red visible light.

By the excitation of the blue, green, and yellow fluorescent materials included in the second fluorescent material layer 82, it is possible to efficiently obtain blue, green, and yellow visible light. Furthermore, it is possible to obtain white light, light in various colors as mixed colors with high efficiency and excellent color rendering properties.

According to the semiconductor light emitting apparatus 500, it is possible to obtain light in a desired color with a high efficiency.

As described above, according to the semiconductor light emitting devices 110, 120, 121, 130, and 131 according to the embodiments, it is possible to improve light extraction efficiency.

The embodiments and their modifications are described as above, but the invention is not limited to these examples.

For example, as a method for forming the stacked structure body 100, other techniques, such as the molecular beam epitaxial growth method, can be used in addition to the organic metal vapor phase epitaxy growth method.

Furthermore, the material of the support substrate 70 is a material having conductivity and not limited to Ge described above. As the support substrate 70, a semiconductor substrate, such as Si, and a metal plate, such as Cu, CuW, can be used. Furthermore, it is not necessary for the whole of the support substrate 70 to have conductivity and a insulating substrate, such as resin, on the surface of which a conductor, such as a metal wire, is formed may be accepted.

The emission wavelength of the quantum well layer is not limited to the above. When a gallium nitride-based semiconductor of GaInN is used as the quantum well layer, emission of 375 nm to 700 nm is obtained.

The embodiments and their modifications are described as above, however, the invention is not limited these examples. For example, each of the embodiments and the modifications thereof, to/from which one skilled in the art appropriately adds/deletes components, or the design of which is changed, or those obtained by appropriately combining the features of each embodiment are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a stacked structure body comprising:
     a first semiconductor layer of having a first conductivity,
     a second semiconductor layer having a second conductivity, wherein the second semiconductor layer is apart from a part of the first semiconductor layer in a stacking direction, and
     a light emitting layer provided between the second semiconductor layer and the part of the first semiconductor layer, wherein the stacked structure body has a first major surface on a side of the first semiconductor layer and a second major surface on a side of the second semiconductor layer;

a first electrode comprising a first contact part contacting another part of the first semiconductor layer on a side of the second major surface, a second electrode comprising a second contact part contacting the second semiconductor layer on the second major surface; and a dielectric layer;

wherein the first major surface has a first surface part and a second surface part, the first surface part being flat and overlapping an entirety of the first contact part when viewed in the stacking direction, the second surface part overlaps the second semiconductor layer when viewed in the stacking direction, the second surface part having has an irregularity, including a plurality of protrusions, wherein a maximum width of a protrusion in a direction perpendicular to the stacking direction is longer than a peak wavelength of light emitted from the light emitting layer, and wherein the first surface part reflects the light according to geometrical optics, and wherein the dielectric layer directly contacts all of the first surface part and does not directly contact the second surface part.

2. The device according to claim 1, wherein
an outer edge of the first surface part in a plane perpendicular to the stacking direction is located outside an outer edge of the first contact part in the plane.

3. The device according to claim 2, wherein
the second electrode has a second electrode surface facing the second semiconductor layer, and
reflectance to the light of the first contact part is lower than reflectance to the light of the second electrode surface.

4. The device according to claim 1, wherein
the stacked structure body has a recess part reaching the first semiconductor layer from the second major surface, and
the first contact part contacts the first semiconductor layer at a bottom surface of the recess part.

5. The device according to claim 1, wherein
the first semiconductor layer comprises a nitride semiconductor, the light emitting layer comprises a nitride semiconductor, and the second semiconductor layer comprises a nitride semiconductor.

6. The device according to claim 1, wherein
the peak wavelength is from 370 nanometers to 400 nanometers.

7. The device according to claim 1, further comprising an insulating layer,
wherein
the first electrode comprises a first bonding metal part and the first bonding metal part comprises a part which is electrically connected to the first contact part,
the first bonding metal part overlaps the second semiconductor layer in the stacking direction, and
the insulating layer is provided at a first position and a second position, wherein the first position is between the first bonding metal part and the second electrode, and wherein the second position is between the first bonding metal part and the second semiconductor layer.

8. The device according to claim 7, wherein
the first contact part and the first bonding metal part are provided integrally.

9. The device according to claim 8, wherein
the first contact part comprises aluminum and the first bonding metal part comprises aluminum.

10. The device according to claim 1, wherein
a shape of the first contact part in a plane perpendicular to the stacking direction and a shape of the first surface part are concentric, and
$\tan^{-1}$ (h/d) is larger than 30 degrees, where d is the diameter of the shape of the first contact part and h is the distance between the first contact part and the first surface part along the first direction.

11. The device according to claim 1, wherein
the irregularity of the second surface part is greater than or equal to double the length of the peak wavelength.

12. The device according to claim 1, wherein
the maximum width is not less than ten times the peak wavelength.

13. The device according to claim 1, wherein
a surface of the irregularity of the second surface part aligns along a crystal surface orientation of the first semiconductor layer.

14. The device according to claim 1, wherein
the second electrode comprises silver.

15. The device according to claim 1, wherein
a shape of one or more of the protrusions is a hexagonal pyramid.

* * * * *